United States Patent
Nagai et al.

(10) Patent No.: US 6,399,453 B2
(45) Date of Patent: Jun. 4, 2002

(54) PROCESS OF MANUFACTURING SEMICONDUCTOR INTEGRATED CIRCUIT DEVICE HAVING AN AMORPHOUS SILICON GATE

(75) Inventors: Ryo Nagai, Mizuho; Norikatsu Takaura, Kokubunji; Hisao Asakura, Ome, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/891,381

(22) Filed: Jun. 27, 2001

(30) Foreign Application Priority Data

Jun. 27, 2000 (JP) .......................................... 2000-192013

(51) Int. Cl.$^7$ ............................................ H01L 21/336

(52) U.S. Cl. .......................... 438/305; 438/306; 438/275

(58) Field of Search ................................. 438/289–291, 438/299–307, 275

(56) References Cited

U.S. PATENT DOCUMENTS 6,210,999 B1 * 4/2001 Gardner et al. ............. 257/332
6,258,643 B1 * 7/2001 Hsu ........................... 427/240

FOREIGN PATENT DOCUMENTS

JP        6-275788        9/1994

* cited by examiner

Primary Examiner—Jey Tsai
(74) Attorney, Agent, or Firm—Antonelli, Terry, Stout & Kraus, LLP

(57) ABSTRACT

Desired operating characteristics are obtained from an MISFET in which a p-type silicon gate electrode is used by preventing the leakage of boron into the channel region in the following way. N-type amorphous silicon $9n$ is formed by ion-implanting phosphorus into an amorphous silicon. Next, boron is ion-implanted in n-type amorphous silicon $9n$ to convert it into p-type amorphous silicon $9p$. Amorphous silicon $9p$ is then crystallized. Finally, the gate electrode of the MISFET is constructed of the p-type polycrystalline silicon, which has been obtained in the above steps, and in which phosphorus and boron have been implanted.

36 Claims, 26 Drawing Sheets

○ PHOSPHORUS ATOMS
⊗ BORON ATOMS

PROCESS OF MANUFACTURING SEMICONDUCTOR INTEGRATED CIRCUIT DEVICE HAVING AN AMORPHOUS SILICON GATE

BACKGROUND OF THE INVENTION

This invention relates in general to a semiconductor integrated circuit device and to the method of its fabrication; and, in particular, the invention relates to a semiconductor integrated circuit device having an MISFET (metal-insulator-semiconductor field-effect transistor) with p-type-conductive silicon gate electrodes.

N-type silicon gate electrodes are normally used in a CMOS (complementary metal-oxide semiconductor) device in which n-channel MISFETs and p-channel MISFETs are formed in the same substrate. In this type of CMOS device, the n-channel MISFETs are often in the surface channel configuration with the p-channel MISFETs in the embedded-channel configuration.

When, however, as processes of fabricating semiconductor integrated circuit devices continually become finer, a designing process with a fineness of 0.2 $\mu$m or narrower is applied to the p-channel MISFET, it is suspected that the embedded-channel configuration will be insufficient in terms of preventing the short channel effect. The p-channel MISFET will thus have to be provided in the surface-channel configuration with p-type silicon gate electrodes. A CMOS device in the so-called dual-gate configuration, which comprises an n-channel MISFET with n-type silicon gate electrodes and a p-channel MISFET with p-type silicon gate electrodes, is being considered.

P-type impurities, such as boron (B), are implanted in the p-type silicon gate electrode. However, since boron has a high diffusion coefficient in the gate-insulating film, boron may encroach into the substrate of the p-channel MISFET and cause a change in the concentration of boron in the channel region. The threshold voltage of the MISFET is thus shifted, its avalanche breakdown voltage deteriorates, and its operating characteristics will be broadly dispersed.

A method for preventing the shift in the threshold voltage caused by the change in the concentration of boron in the channel region has been disclosed in Official Patent Gazette H.6-275788. Boron ions are implanted into an n-type polysilicon film, into which n-type impurities have been uniformly placed, to convert the film into p-type polysilicon. The gate electrodes are then formed by patterning this polysilicon film. After that, impurities are implanted into the substrate with the gate electrodes acting as masks for self-alignment. Here, since the activation temperature of the implanted impurities is set rather low, in the range from 800 to 900° C., the diffusion of boron is prevented.

SUMMARY OF THE INVENTION

The inventors, however, have found that when boron ions are implanted in the polycrystalline silicon film, boron atoms reach the gate-insulating film and even the interface with the substrate by the channeling effect. The result is a change in the concentration of boron in the channel region.

Moreover, when the gate electrodes are used as masks for the self-aligned implantation of impurities in the substrate, the impurities are simultaneously implanted in the polycrystalline silicon film, which configures the gate electrodes. The threshold voltage would then be expected to change and cause deterioration in the reproducibility of the MISFET's operating characteristics.

The object of this invention is to provide a technique that can obtain the desired operating characteristics for an MISFET with p-type silicon gate electrodes.

The foregoing object and novel features of this invention will be clarified by the following specification together with the accompanying drawings.

A typical example of the invention disclosed in this application is briefly summarized in the following.

(1) The semiconductor integrated circuit device of this invention having an MISFET comprises:

a gate-insulating film located on the substrate;

gate electrodes, which are located on the gate-insulating film and constructed of the p-type polycrystalline silicon film, in which p-type impurities and n-type impurities have been implanted;

an insulating film, which is located over the p-type polycrystalline silicon film and has the same flat form as the p-type polycrystalline silicon film; and the source and drain of a p-channel or of an n-channel, which are located in the substrate on both sides of the gate electrode.

The method of fabricating a semiconductor integrated circuit device of this invention, when forming an MISFET with p-type silicon gate electrodes, comprises the steps of:

forming a gate-insulating film on the surface of the substrate;

depositing an amorphous silicon film on the gate-insulating film;

forming an n-type amorphous silicon film by ion-implanting n-type impurities in the amorphous silicon film;

converting the n-type amorphous silicon film into a p-type amorphous silicon film by ion-implanting p-type impurities in the n-type amorphous silicon film;

converting the p-type amorphous silicon film into a p-type polycrystalline silicon film by a process of crystallization;

forming gate electrodes by etching the insulating film, which has been deposited on the p-type polycrystalline silicon film immediately before this process, and p-type polycrystalline silicon film in turn; and forming a semiconductor region in which the source and drain are to be constructed.

Referring to the method described above, implanting the n-type impurities in the p-type polycrystalline silicon film, of which the gate electrodes are constructed, prevents the diffusion of the p-type impurities, such as boron, which have been injected in said p-type polycrystalline silicon film. This prevents changes in the concentration of boron in the channel region.

Again referring to the method described above, the channeling effect is prevented by implanting the n-type impurities and p-type impurities in the amorphous silicon film, which has been deposited over the gate-insulating film. As a result, changes in the concentration of boron in the channel region which are caused by the ion-implanted impurities reaching the gate-insulating film and even the interface with the substrate, are prevented.

Again referring to the method described above, the concentration of impurities in the p-type polycrystalline silicon film, of which the gate electrodes are constructed, and the concentration of impurities in the semiconductor region, of which the source and drain are constructed, are optimized independently. As a result, the optimal device configuration for an MISFET can easily be provided.

DETAILED DESCRIPTION OF THE PREFERRED EMBODIMENT

This invention is described below in detail based on an embodiment shown in the accompanying drawings.

Identical numerical references in the figures describing the embodiment refer to the same items and their descriptions are not repeated.

The method of fabricating a DRAM (dynamic random access memory), which is one embodiment of this invention, will be described with reference to FIGS. 1 to 22.

Figure 1:
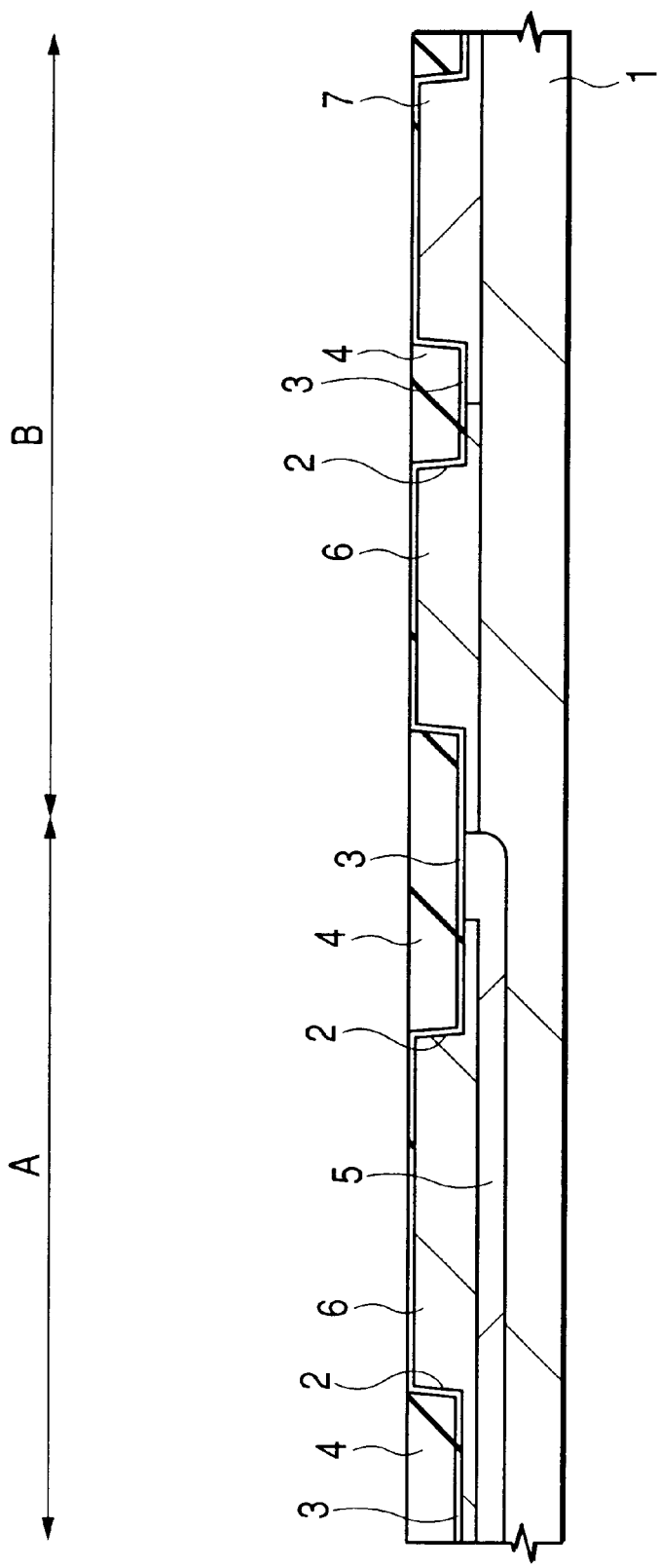
FIG. 1 is a cross-sectional view through the key parts of the semiconductor substrate and shows a step in the method of fabricating a DRAM, which is one embodiment of this invention.

As shown in FIG. 1, p-type substrate 1 with a specific resistance of approximately 10 Ωcm is prepared, and groove 2 is formed in the major surface of this substrate 1. Thermal oxidation is applied to substrate 1 to form a silicon oxide film 3. After that, a silicon oxide film is deposited, and it is polished by CMP (chemical-mechanical polishing) so that a silicon oxide film only remains in groove 2. Isolation region 4 is thus formed.

Moreover, n-type impurities such as phosphorus (P) ions are implanted in the region of substrate 1, where memory cells are to be formed (region A: memory array), to form n-type semiconductor region 5. P-type impurities, such as boron (B) ions, are implanted in the memory array and part of the peripheral circuit (region B), (the region -where an n-channel MISFET is to be formed), to form p-type well 6. N-type impurities, such as phosphorus ions, are implanted in the other part of the peripheral circuit (region B), (the region where a p-channel MISFET is to be formed), to form n-type well 7. After the ion implantation of boron and phosphorus, impurities such as boron fluoride ($BF_2$) ions are implanted in p-type well 6 and n-type well 7 for adjusting the threshold voltage of the MISFET. N-type semiconductor region 5 is designed to prevent the encroachment of noise from the input/output circuit into p-type well 6 of the memory array via substrate 1.

Figure 2:
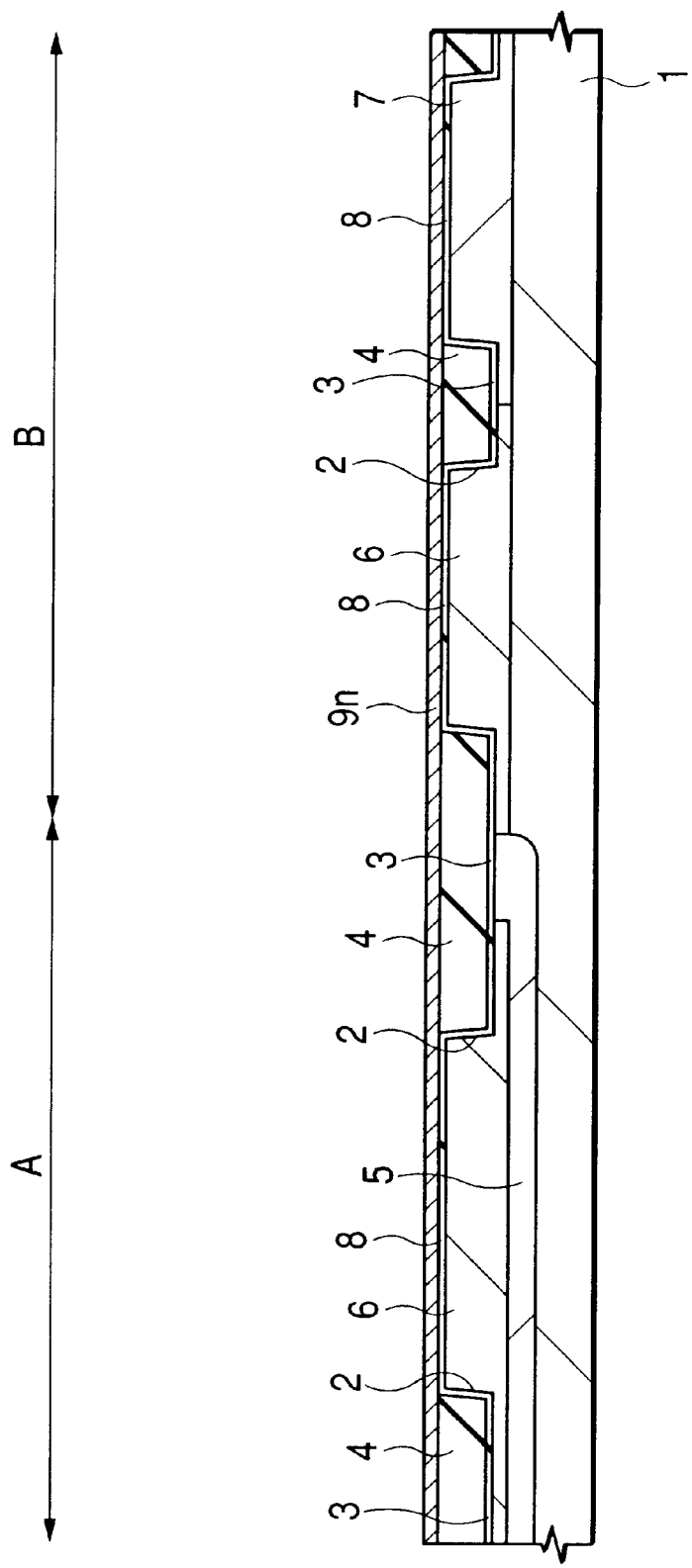
FIG. 2 is a cross-sectional view through the key parts of the semiconductor substrate and shows a step in the method of fabricating DRAM, which is one embodiment of this invention.

As shown in FIG. 2, the surfaces of both p-type well 6 and n-type well 7 are wet-cleaned by using a solution of hydrofluoric acid (HF). Substrate 1 is then wet-oxidized at approximately 850° C. to form clean gate-insulating film 8, made of silicon oxide with a depth of approximately 6 to 7 nm, over the surfaces of both p-type well 6 and n-type well 7. An amorphous silicon film with a depth of 100 nm or less, for example 70 nm or so, is then deposited on the surface of gate-insulating film 8 by chemical vapor deposition (CVD). After that, the n-type impurities, for example phosphorous ions, are implanted over the entire surface of this amorphous silicon film to form n-type amorphous silicon film 9n.

Figure 3:
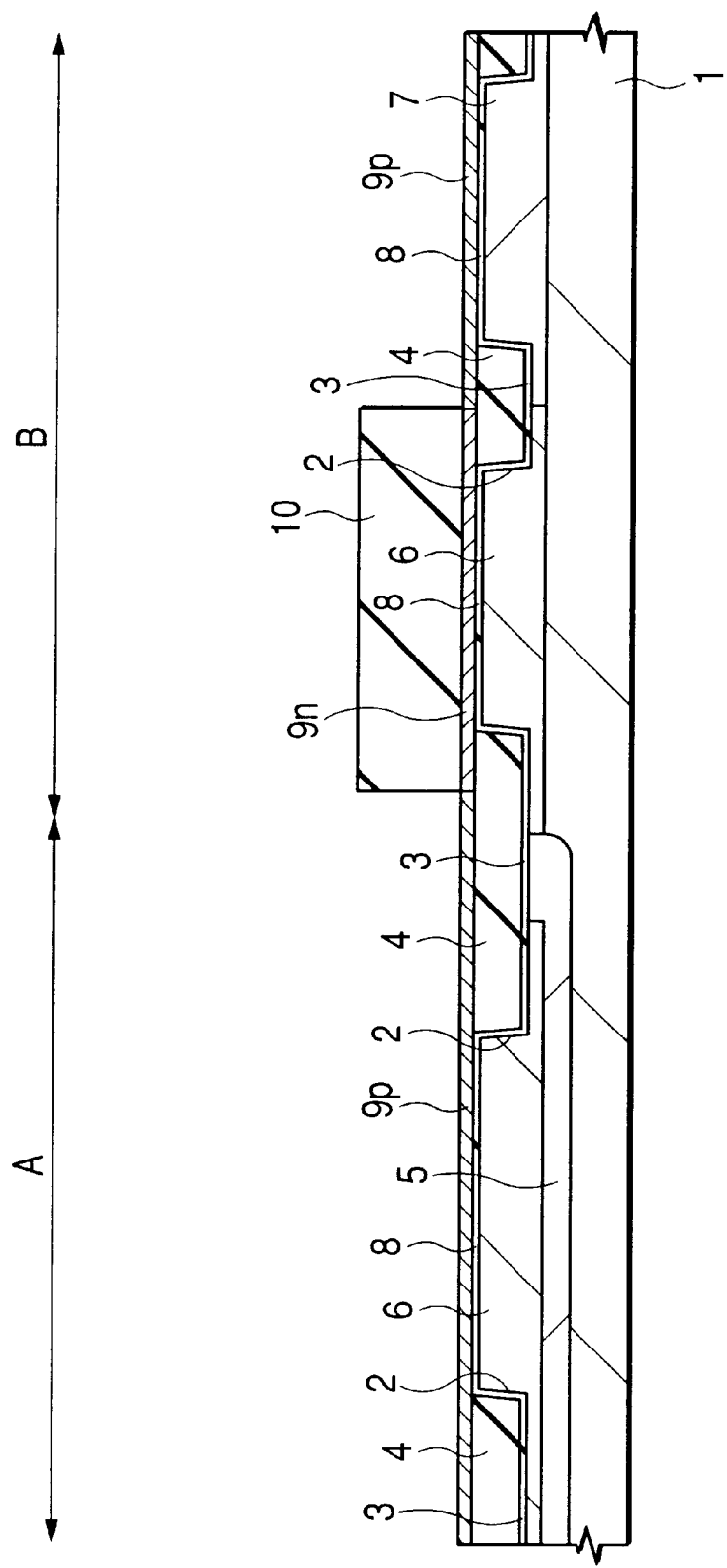
FIG. 3 is a cross-sectional view through the key parts of the semiconductor substrate and shows a step in the method of fabricating a DRAM, which is one embodiment of this invention.

As shown in FIG. 3, p-type impurities, such as boron ions, are then implanted using photoresist pattern 10 as a mask. Accordingly, n-type amorphous silicon film 9n, in the region where the p-channel MISFETs of the memory array (region A) and peripheral circuit (region B) are to be formed, is converted to p-type amorphous silicon film 9p.

Figure 4A:
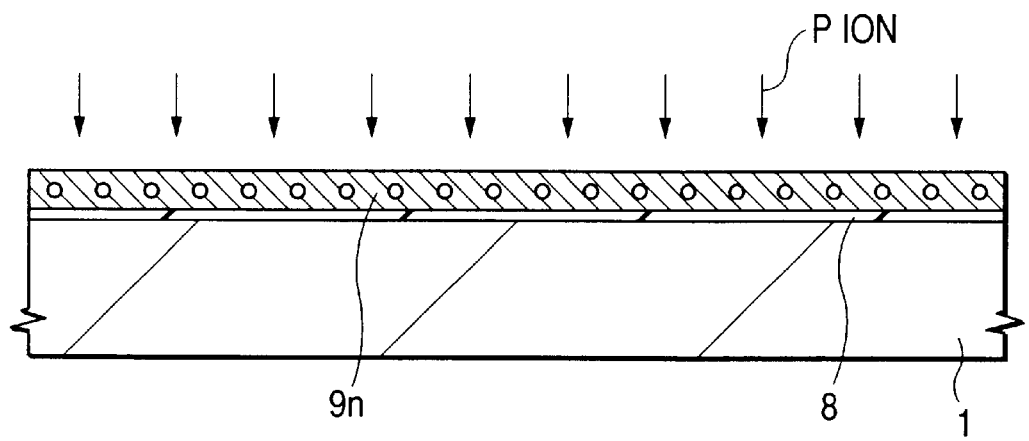
FIGS. 4(a) and 4(b) are magnified cross-sectional views of part of the semiconductor substrate and show successive steps in the method of fabricating a DRAM, which is one embodiment of this invention.
Figure 4B:
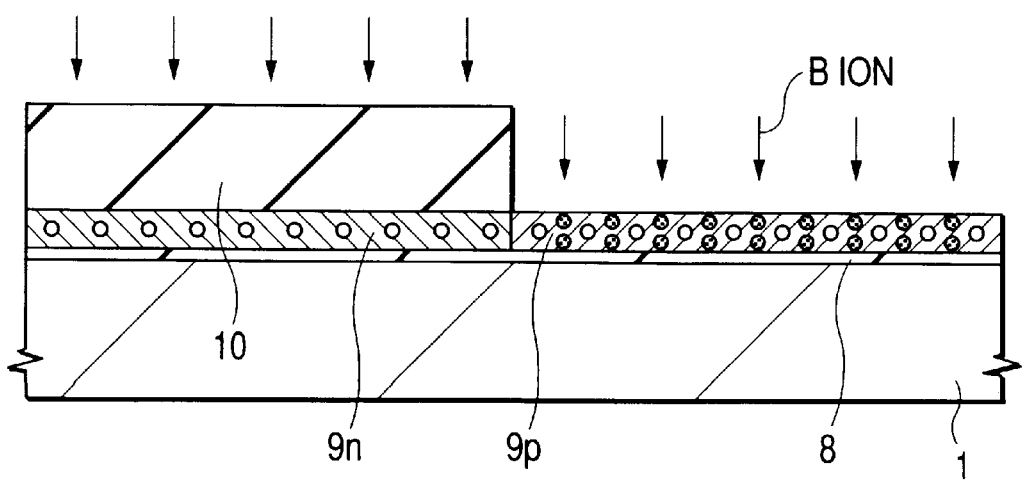

FIGS. 4(a) and 4(b) are schematic magnified views that show successive slips in the method of fabricating n-type amorphous silicon film 9n and p-type amorphous silicon film 9p. Firstly, as shown in FIG. 4(a), phosphorus ions are implanted over the entire surface of the amorphous silicon film, which has been deposited on the surface of gate-insulating film 8, to form n-type amorphous silicon film 9n. After that, as shown in FIG. 4(b), boron ions are implanted using photoresist pattern 10 as a mask. Since the conductivity type of exposed n-type amorphous silicon film 9n is reversed so that it becomes p-type amorphous silicon film 9p, n-type amorphous silicon film 9n and p-type amorphous silicon film 9p have been formed as the same amorphous silicon film.

Figure 5:
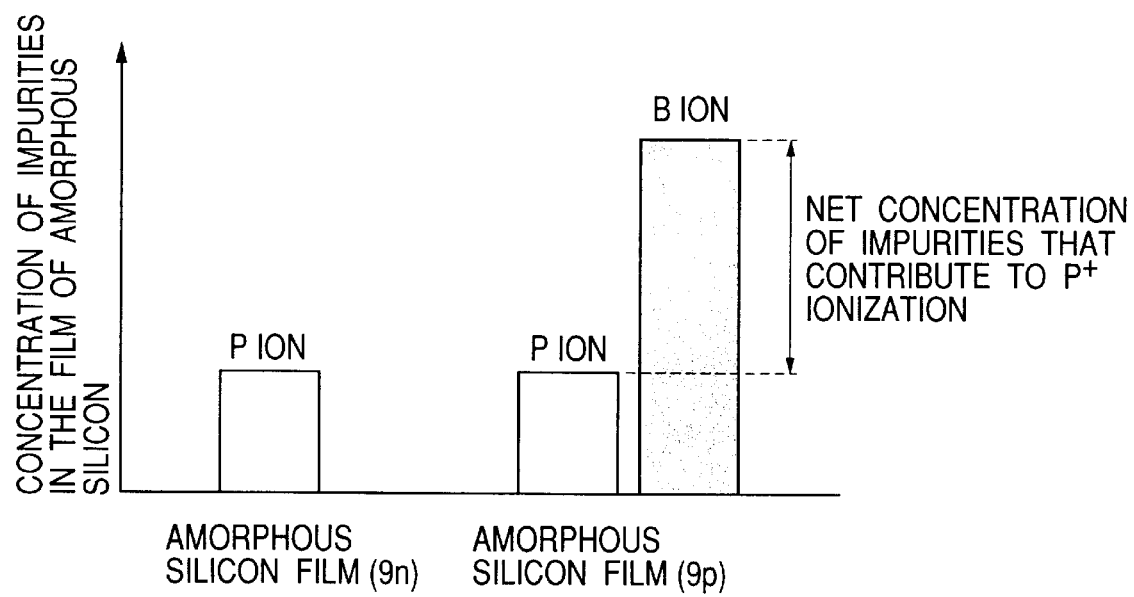
FIG. 5 is a graph that shows the concentration of impurities in the n-type amorphous silicon and p-type amorphous silicon films.

Here, as shown in FIG. 5, in order to reverse the conductivity type of n-type amorphous silicon film 9n so that it becomes p-type amorphous silicon film 9p, the dosage of boron ions to be implanted in n-type amorphous silicon film 9n should be relatively greater than the dosage of phosphorus ions which has been implanted. For example, with the accelerating energy of 10 keV for applying a dosage of $2 \times 10^{15}$ $cm^{-2}$ as the conditions of phosphorus-ion implantation, the accelerating energy of 5 keV for applying a dosage of $3 \times 10^{15}$ $cm^{-2}$ are suitable conditions for boron-ion implantation.

In addition, to reverse the conductivity type of n-type amorphous silicon film 9n to that of p-type amorphous silicon film 9p without implanting excess boron ions, it is desired that the concentration of impurities in the n-type amorphous silicon film 9n be set as low as possible. However, on the other hand, when the concentration of impurities in the n-type amorphous silicon film 9n is low, the problem of depletion in the n-type amorphous silicon film 9n arises.

Figure 6A:
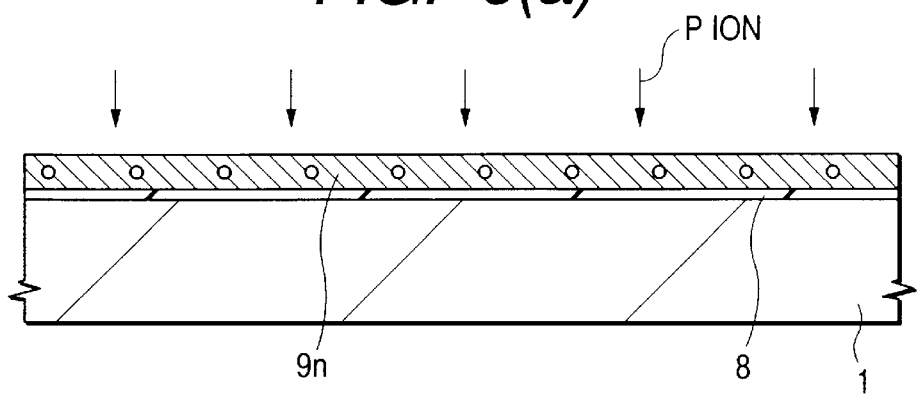
FIGS. 6(a), 6(b), and 6(c) are magnified cross-sectional views of part of the semiconductor substrate and show successive steps in the method of fabricating a DRAM, which is one embodiment of this invention.
Figure 6B:
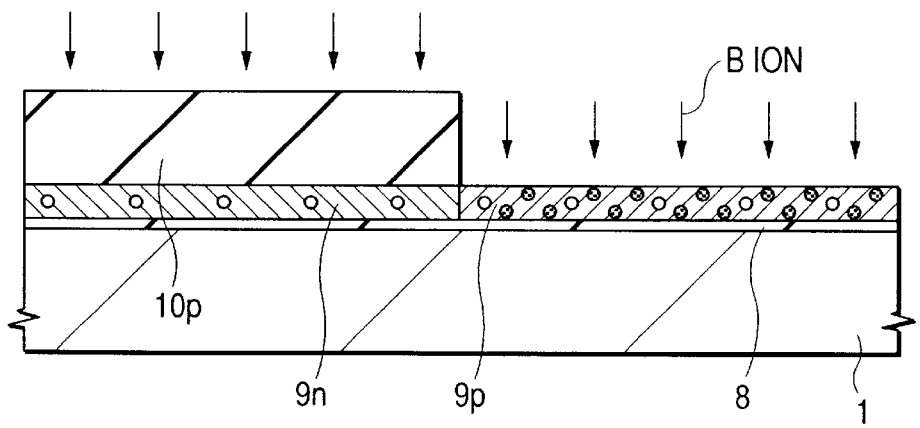
Figure 6C:
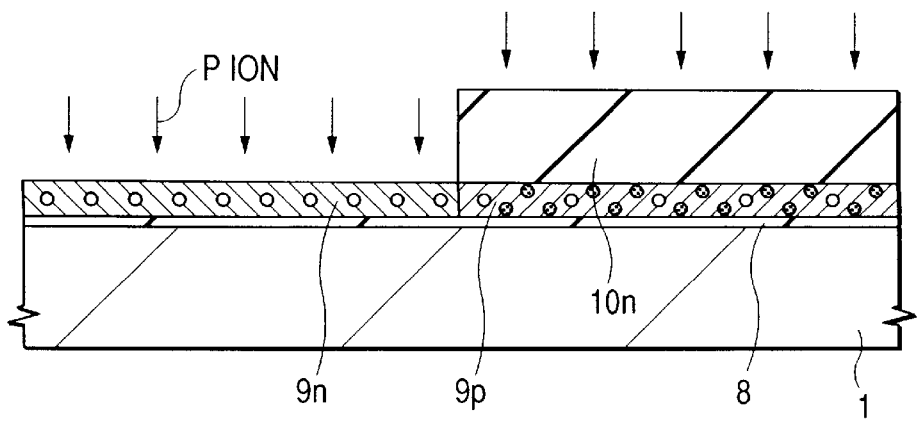

When optimization of the concentration of impurities in the n-type amorphous silicon film 9n and the concentration of impurities in the p-type amorphous silicon film 9p is required, n-type amorphous silicon film 9n and p-type amorphous silicon film 9p are formed by, for example, the procedure shown in FIGS. 6(a), 6(b), and 6(c). Firstly, as shown in FIG. 6(a), phosphorus ions are implanted to a relatively low concentration over the entire surface of the amorphous silicon film, which has been deposited on the surface of gate-insulating film 8, to form n-type amorphous silicon film 9n. After that, as shown in FIG. 6(b), boron ions are implanted, using photoresist pattern 10p as a mask, to reverse the conductivity type of the n-type amorphous silicon film 9n so that it becomes p-type amorphous silicon film 9p. Then, as shown in FIG. 6(c), phosphorus ions are implanted, using photoresist pattern 10n (the inverse of photoresist pattern 10p) as a mask. Consequently, the number of phosphorus atoms in the n-type amorphous silicon film 9n can be optimized to a higher concentration as designed.

Figure 7:
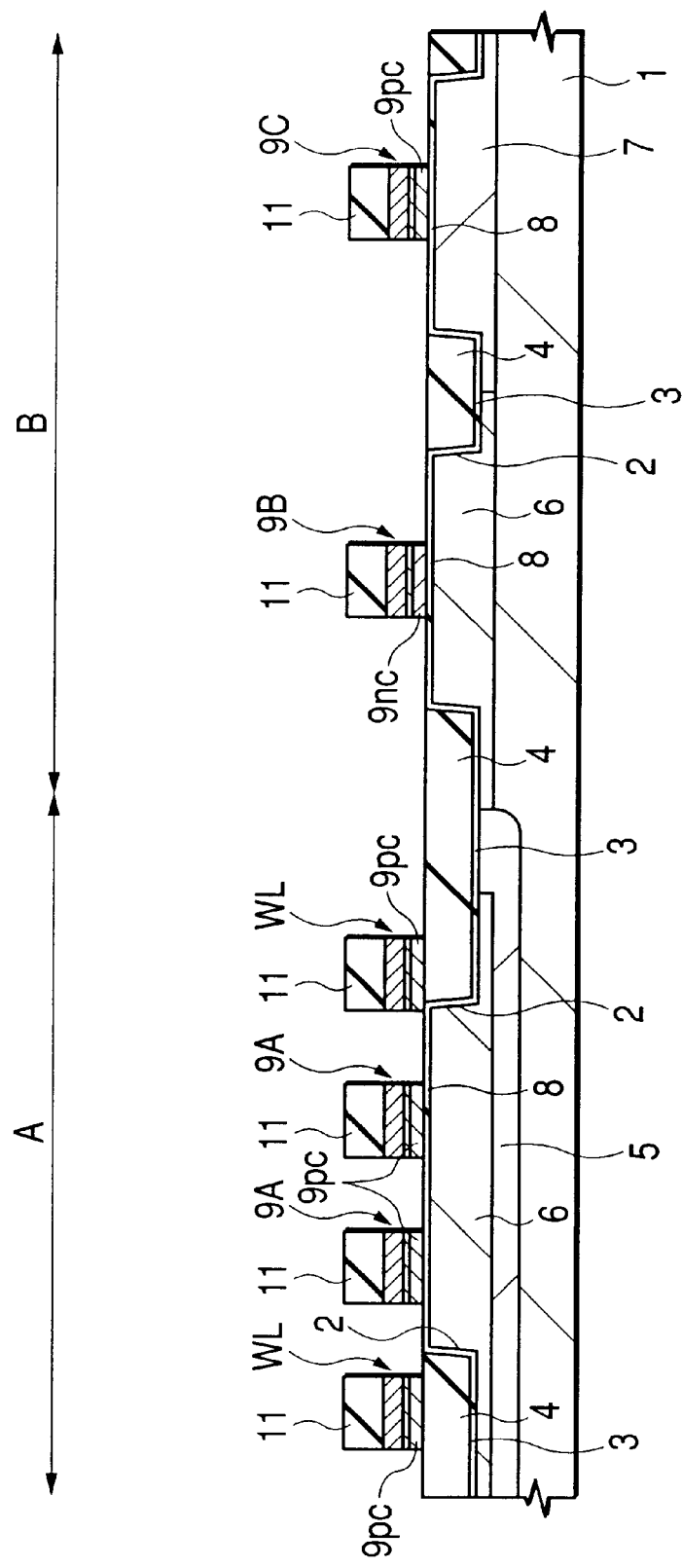
FIG. 7 is a cross-sectional view through the key parts of the semiconductor substrate and shows a step in the method of fabricating a DRAM, which is one embodiment of this invention.

After removing photoresist pattern 10, as shown in FIG. 7, substrate 1 is annealed at 950° C. for 10 to 60 seconds to crystallize n-type amorphous silicon film 9n and p-type amorphous silicon film 9p. This converts n-type amorphous silicon film 9n to n-type polycrystalline silicon film 9nc, and p-type amorphous silicon film 9p to p-type polycrystalline silicon film 9pc.

In an alternative method, phosphorus ions are implanted over the entire surface of the amorphous silicon film to form n-type amorphous silicon film 9n, then this n-type amorphous silicon film 9n is crystallized by annealing so that it becomes n-type polycrystalline silicon film 9nc. Boron ions are then implanted in n-type polycrystalline silicon film 9nc using photoresist pattern 10 as a mask. As a result, some of n-type polycrystalline silicon film 9nc is converted to p-type polycrystalline silicon film 9pc.

Next, sputtering is used to deposit a tungsten nitride (WN) film to a depth of approximately 5 nm and a tungsten (W) film to a depth of approximately 100 nm on n-type polycrystalline silicon film 9nc and p-type polycrystalline silicon film 9pc. Silicon nitride film 11 is then deposited to a depth of approximately 150 nm by CVD.

After that, gate electrodes 9A, 9B, and 9C are formed by patterning these films using a photoresist as a mask. Gate electrode 9A functions not only as a gate electrode of the memory-cell-selecting MISFET, but also as word line WL outside the active region. The base of this gate electrode 9A (word line WL) is made of p-type polycrystalline silicon film 9pc. Gate electrode 9B functions as a gate electrode of the n-channel MISFET of the peripheral circuit, and the base of this gate electrode 9B is made of n-type polycrystalline silicon film 9nc. Furthermore, gate electrode 9C functions as a gate electrode of the p-channel MISFET of the peripheral circuit, and the base of this gate electrode 9C is made of p-type polycrystalline silicon film 9pc.

Since gate electrode 9A (word line WL) is mainly made up of a tungsten (W) film and a polycrystalline silicon film, that is, it is in the so-called polymetal configuration, its resistance is lower than that of a gate electrode made up of a polycrystalline silicon film. As a consequence, signal delays in the word lines are reduced. Gate electrode 9A (word line WL) can also be made up of a bilayer film, which includes a refractory-metal silicide film and a polycrystalline silicon film, i.e., the so-called polycide configuration. In the same way as with the polymetal configuration, the resistance of a gate electrode in the polycide configuration is lower than that of a gate electrode made up of only a polycrystalline silicon film, so signal delays in the word lines are reduced.

The tungsten nitride (WN) film, which is deposited between the tungsten (W) film and the polycrystalline silicon film, functions as a barrier material. This film prevents reaction between the tungsten (W) film and the polycrystalline silicon film during high-temperature annealing and thus prevents the formation of a high-resistance silicide layer at their interface. A tungsten nitride (WN) film is not the only suitable barrier material; a titanium nitride (TiN) film can also be used.

A method of using hydrofluoric acid (HF), etc., to remove the dry-etching residue and the photoresist residue, which have remained on the surface of substrate 1, will be described.

Figure 8:
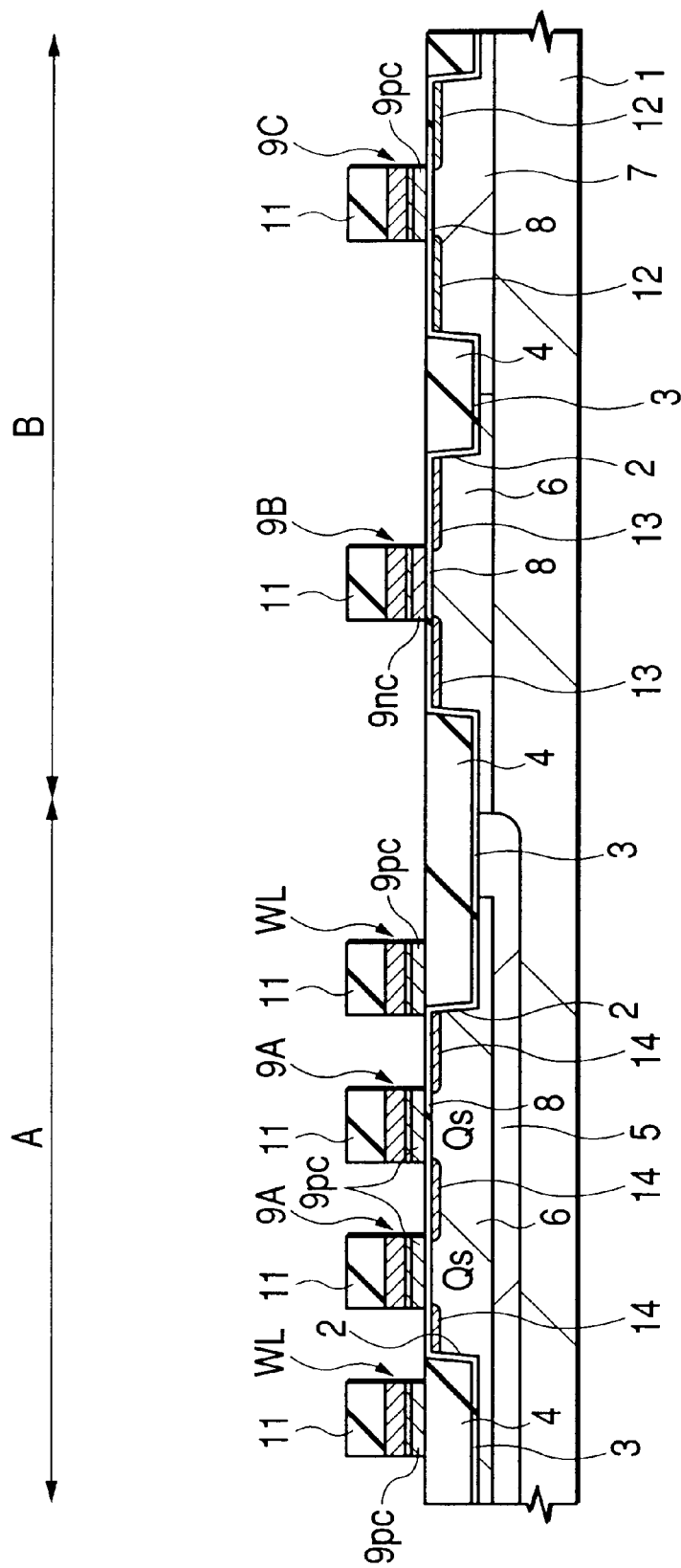
FIG. 8 is a cross-sectional view through the key parts of the semiconductor substrate and shows a step in the method of fabricating a DRAM, which is one embodiment of this invention.

As shown in FIG. 8, p-type impurities, such as boron ions, are implanted in n-well 7 of the peripheral circuit to form, on both sides of gate electrode 9C, p⁻-type semiconductor regions 12 in n-well 7. N-type impurities, such as phosphorus ions, are then implanted in p-well 6 of the peripheral circuit to form, on both sides of gate electrode 9B, n⁻-type semiconductor regions 13 in p-well 6. Furthermore, n-type impurities, such as phosphorus ions, are implanted in p-well 6 of the memory array to form, on both sides of gate electrode 9A, n-type semiconductor regions 14 in p-well 6. The creation of memory-cell-selecting MISFET Qs is thus, almost complete. Substrate 1 is also annealed at 950° C. for approximately 10 seconds after the ion implantation.

Figure 9:
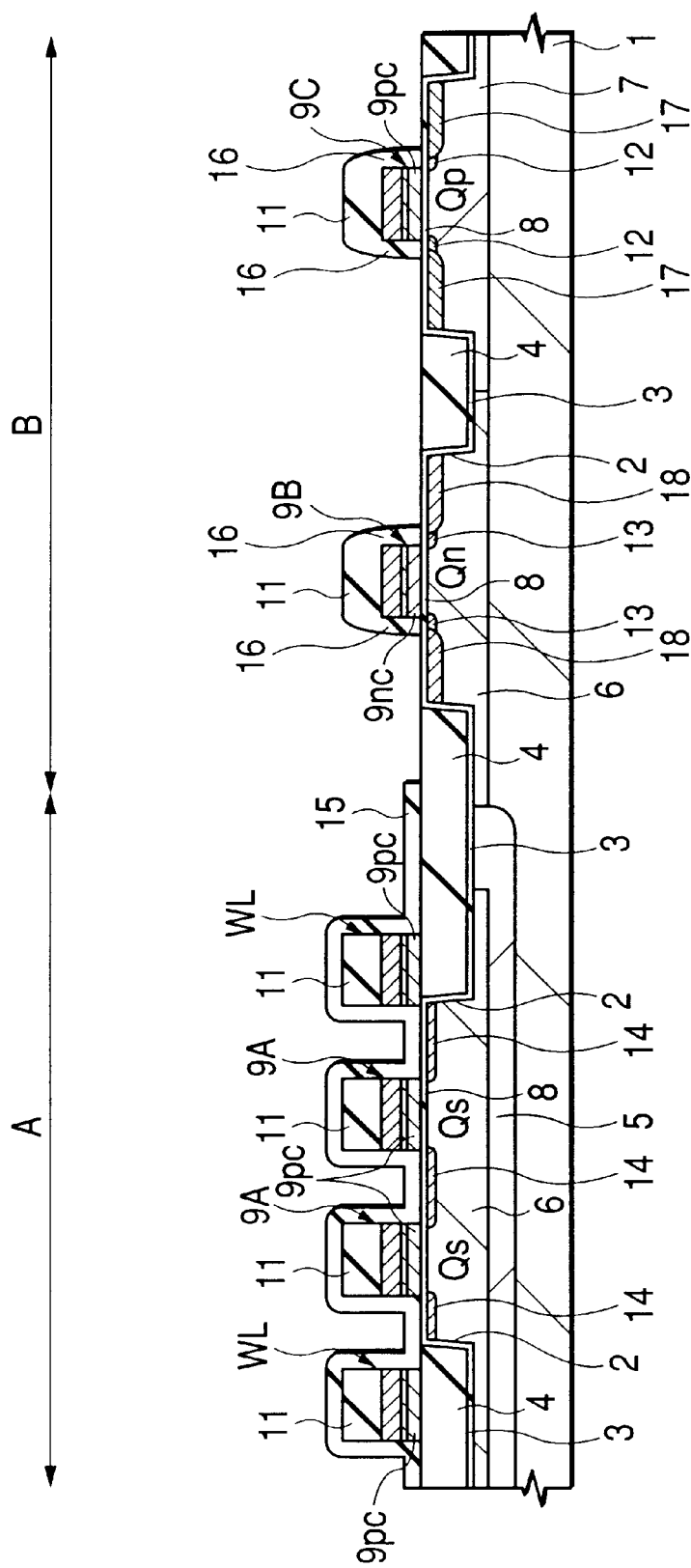
FIG. 9 is a cross-sectional view through the key parts of the semiconductor substrate and shows a step in the method of fabricating a DRAM, which is one embodiment of this invention.

As shown in FIG. 9, silicon nitride film 15 is deposited on substrate 1 by plasma CVD to a depth of approximately 50 nm, and silicon nitride film 15 in the memory array is then covered by a photoresist. After that, silicon nitride film 15 in the peripheral circuit is anisotropically etched. As a result, side-wall spacers 16 are formed on sidewalls of gate electrodes 9B and 9C. Silicon nitride film 15 in the memory array acts as an etching stopper to prevent etching of the silicon oxide film in groove 2 of element region 4, during the later step of forming contact holes (openings) in the space between gate electrodes 9A (word line WL) by dry etching.

After removing said photoresist, p-type impurities such as boron ions, are implanted in n-well 7 of the peripheral circuit to form p⁺-type semiconductor regions 17 (source and drain) for the p-channel MISFET. N-type impurities, such as arsenic (As) ions, are implanted in p-well 6 of the peripheral circuit to form n⁺-type semiconductor regions 18 (source and drain) for the n-channel MISFET. In addition, substrate 1 is annealed at 950° C. for 10 seconds after the ion implantation. The creation of p-channel MISFET Qp and n-channel MISFET Qn of the peripheral circuit is thus almost complete.

Figure 10A:
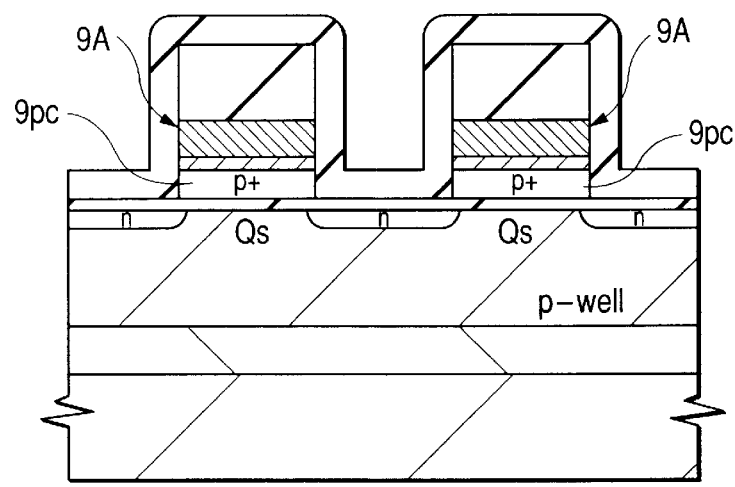
FIGS. 10(a), 10(b), and 10(c) are schematic magnified cross-sectional views of the semiconductor substrate and respectively show the memory-cell-selecting MISFET, n-channel MISFET, and p-channel MISFET of a DRAM, which is one embodiment of this invention.
Figure 10B:
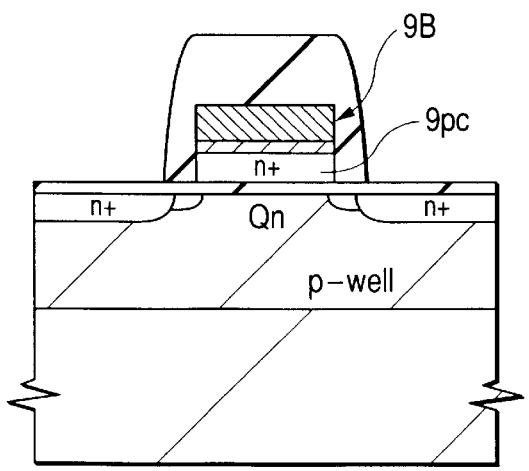
Figure 10C:
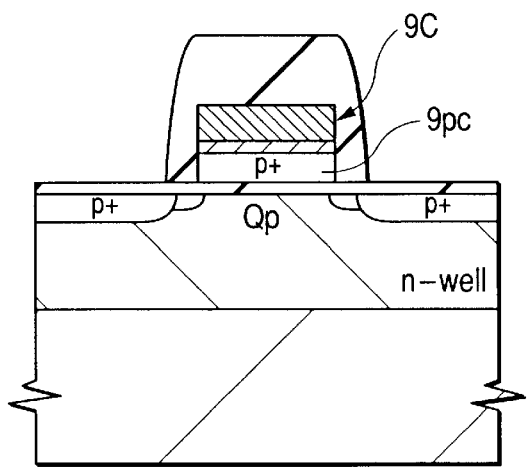

FIGS. 10(a), 10(b), and 10(c) are schematic magnified views of memory cell-selecting MISFET Qs, n-channel MISFET Qn, and p-channel MISFET Qp. The base of gate electrode 9A (word line WL) for memory-cell-selecting MISFET Qs is made of p-type polycrystalline silicon film 9pc, in which phosphorus and boron ions have been implanted. Gate electrode 9A (word line WL) is thus in the so-called p⁺-gate n-channel configuration (FIG. 10(a)). The base of gate electrode 9B for n-channel MISFET Qn is made of n-type polycrystalline silicon film 9nc, in which phosphorus ions have been implanted. Gate electrode 9B is thus in the so-called n⁺-gate n-channel configuration (FIG. 10(b)). Furthermore, the base of gate electrode 9C for p-channel MISFET Qp is made of p-type polycrystalline silicon film 9pc, in which phosphorus and boron ions have been implanted. Gate electrode 9C is thus in the so-called p⁺-gate p-channel configuration (FIG. 10(c)).

Figure 11:
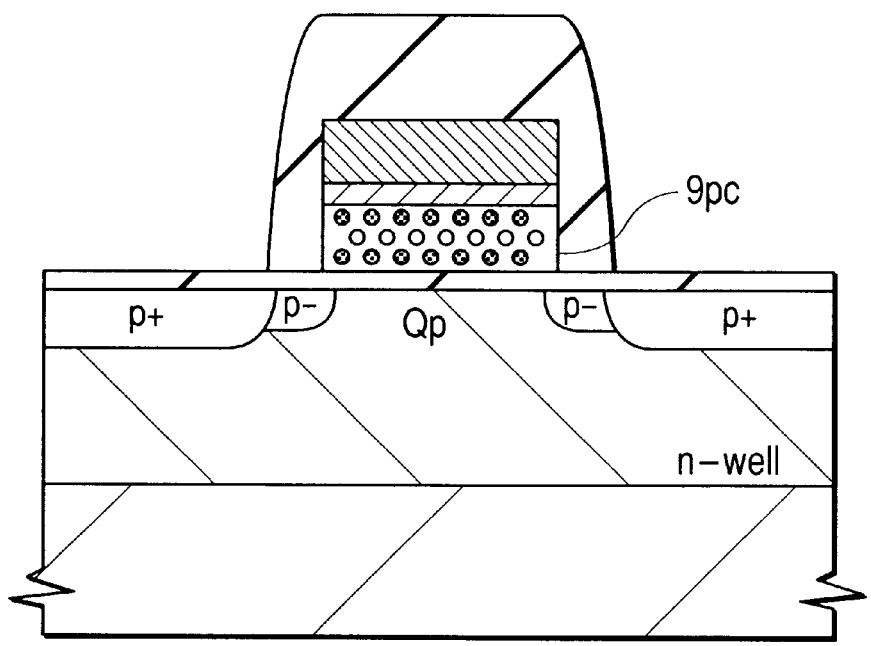
FIG. 11 is a schematic magnified cross-sectional view of the semiconductor substrate and shows the p-type silicon gate electrode of the p-channel MISFET, which is one embodiment of this invention.

FIG. 11 is a schematic magnified view of p-channel MISFET Qp. Though the base of gate electrode 9C is made of p-type polycrystalline silicon film 9pc, in which phosphorus and boron ions have been implanted, the concentration of boron must be higher than that of phosphorus in p-type polycrystalline silicon film 9pc.

Figure 12:
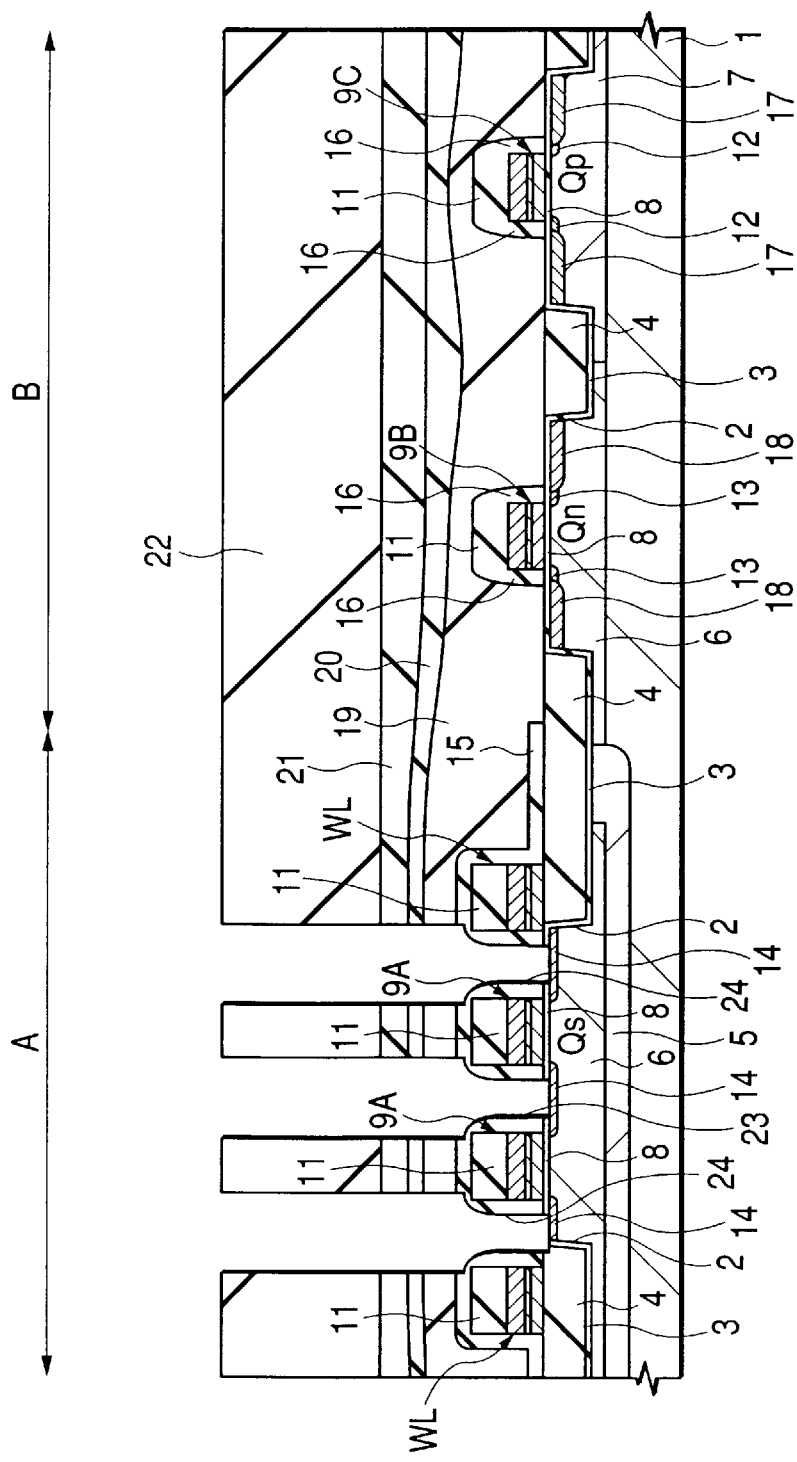
FIG. 12 is a cross-sectional view through the key parts of the semiconductor substrate and shows a step in the method of fabricating a DRAM, which is one embodiment of this invention.

Next, as shown in FIG. 12, spin-on-glass (SOG) film 19 is formed over substrate 1 to a depth of approximately 300 nm by spin-coating. Substrate 1 is then annealed at 800° C. for approximately 60 seconds to sinter the spin-on-glass (SOG) film 19.

After silicon oxide film 20 is deposited to a depth of approximately 600 nm on the spin-on-glass (SOG) film 19, this silicon oxide film 20 is polished by CMP to flatten its surface. Silicon oxide film 20 is deposited by plasma CVD, for example, using tetraethyl orthosilicate (TEOS: $Si(OC_2H_5)_4$) and ozone ($O_3$) as source gases.

Furthermore, silicon oxide film 21 is deposited to a depth of approximately 100 nm on silicon oxide film 20. This silicon oxide film 21 is deposited to cover the fine scratches on the surface of said silicon oxide film 20 that are a result of CMP. Silicon oxide film 21 is deposited by plasma CVD, for example, using TEOS and $O_3$ as source gases. As an alternative to silicon oxide film 21, a phospho-silicate glass (PSG) film can be deposited on the silicon oxide film 20.

Moreover, photoresist 22 is formed on silicon oxide film 21. Silicon oxide films 20 and 21 and spin-on-glass (SOG) film 19, located on the upper part of n-type semiconductor regions 14 (source and drain) of memory-cell-selecting MISFET Qs, are removed by dry etching using this photoresist 22 as a mask.

In addition, said etching is performed under the following condition. The etching rates of silicon films 20 and 21 and spin-on-glass (SOG) film 19 are greater than that of silicon nitride film 15. As a result, silicon nitride film 15, which covers the upper parts of n-type semiconductor region 14 and isolation region 4, must not be completely etched out.

Next, contact hole 23 is formed over one (source or drain) n-type semiconductor region 14 and contact hole 24 is formed over the other (source or drain) n-type semiconductor region 14. For this process, said photoresist 22 is used as a mask for dry-etching to remove silicon nitride film 15 and gate-insulating film 8 over respective n-type semiconductor regions 14 (source and drain) of the memory-cell-selecting MISFET Qs.

The conditions of this etching are such that the silicon nitride film 15 is etched more quickly than the silicon oxide films (the silicon oxide films in gate-insulating film 8 and isolation region 4) so that n-type semiconductor region 14 and isolation region 4 are not deeply etched. The conditions of this etching are also such that silicon nitride film 15 is anisotropically etched so that silicon nitride film 15 remains on the sidewalls of gate electrodes 9A (word lines WL). Contact holes 23 and 24 with their fine diameters, below the limitations of photolithographic resolution, are formed by a method that is self-aligning with respect to gate electrodes 9A (word lines WL).

Figure 13:
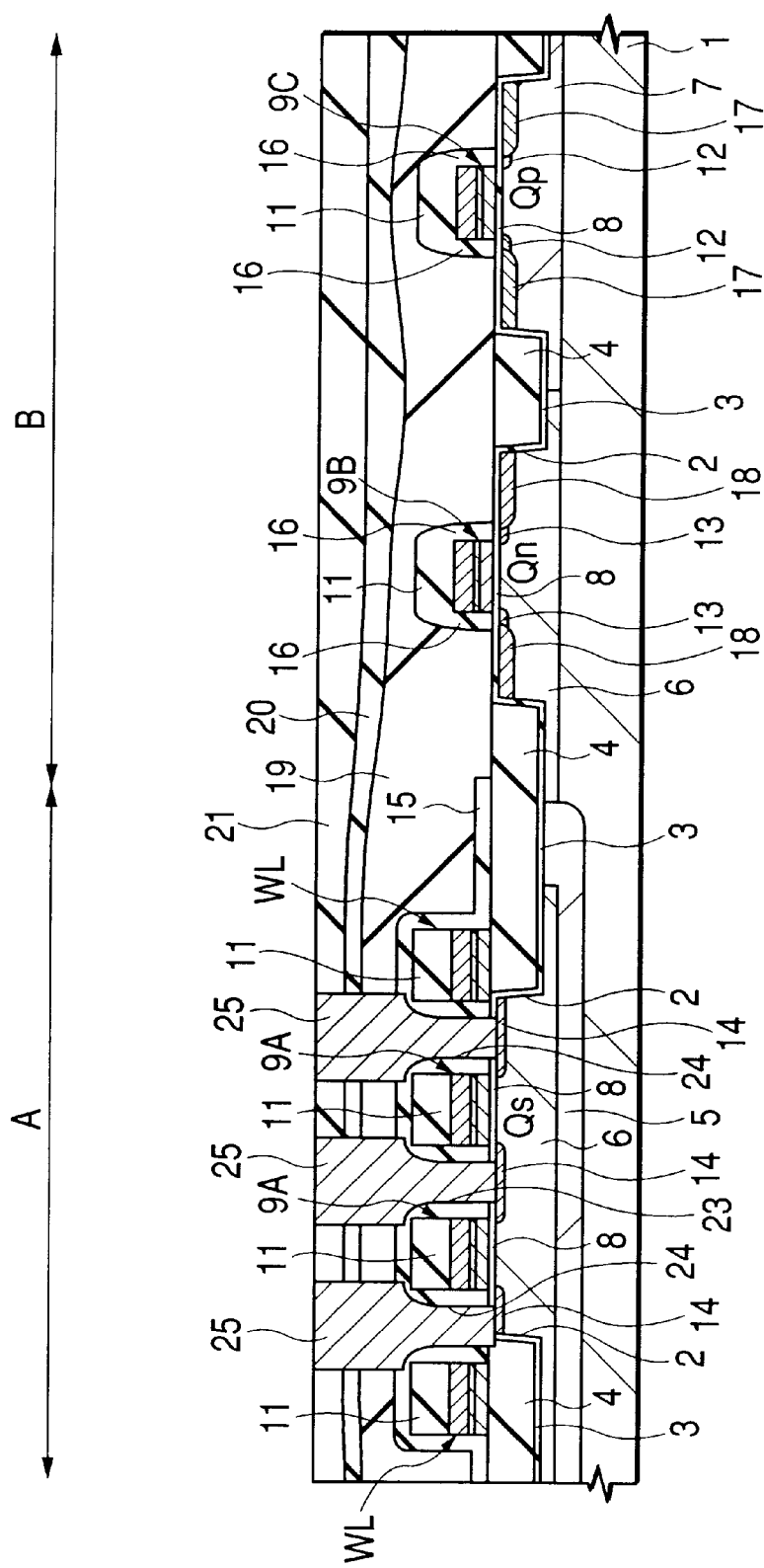
FIG. 13 is a cross-sectional view through the key parts of the semiconductor substrate and shows a step in the method of fabricating a DRAM, which is one embodiment of this invention.

Next, photoresist 22 is removed. A polycrystalline silicon film, doped with n-type impurities (for example, phosphorous), is deposited by CVD on silicon oxide film 21, and plugs 25 are then formed of the materials that remain inside contact holes 23 and 24 after CMP has been used to polish this polycrystalline silicon film, as shown in FIG. 13.

Next, silicon oxide film 26 is deposited to a thickness of approximately 200 nm on silicon oxide film 21, and substrate 1 is annealed at approximately 800° C. Silicon oxide film 26 is deposited by plasma CVD, for example, using TEOS and $O_3$ as source gases. Furthermore, n-type impurities in the polycrystalline silicon film which constitutes plugs 25, diffuse by this annealing into n-type semiconductor region 14 (source and drain) of the memory-cell-selecting MISFET Qs from the bottom of contact holes 23 and 24. The resistance of n-type semiconductor region 14 (source and drain) is thus lowered.

Figure 14:
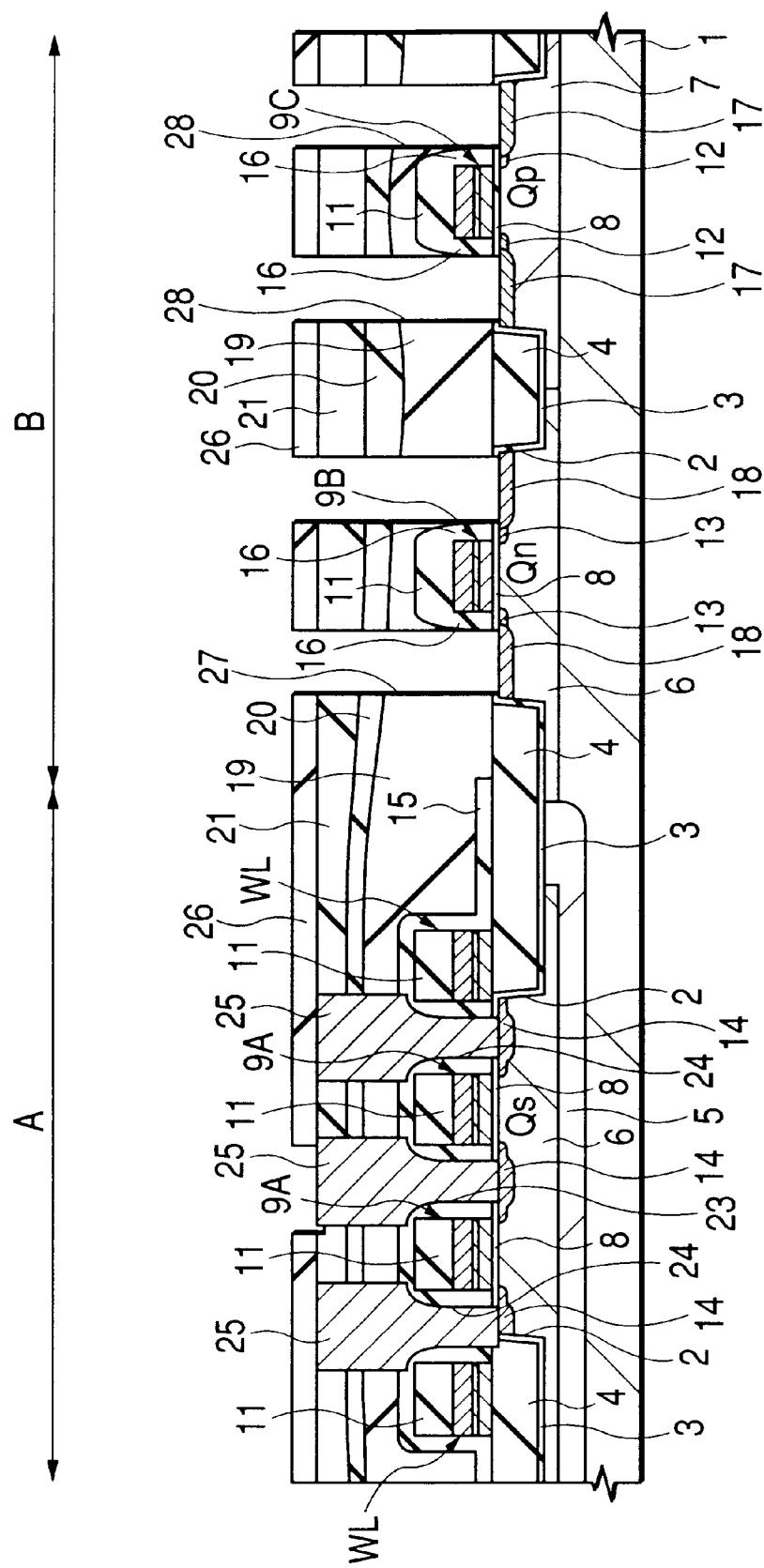
FIG. 14 is a cross-sectional view through the key parts of the semiconductor substrate and shows a step in the method of fabricating a DRAM, which is one embodiment of this invention.

Next, silicon oxide film 26 on said contact hole 23 is removed by dry-etching using a photoresist as a mask, and the surfaces of plugs 25 are exposed. Said photoresist is then removed. A new photoresist is then used as a mask for dry etching through silicon oxide films 26, 21, and 20, SOG film 19, and gate-insulating film 8 in the peripheral circuit region. Contact hole 27 is thus formed over $n^+$-type semiconductor region 18 (source and drain) of the n-channel MISFET Qn, and contact hole 28 is formed over $p^+$-type semiconductor region 17 (source and drain) of the p-channel MISFET Qp, as shown in FIG. 14.

Figure 15:
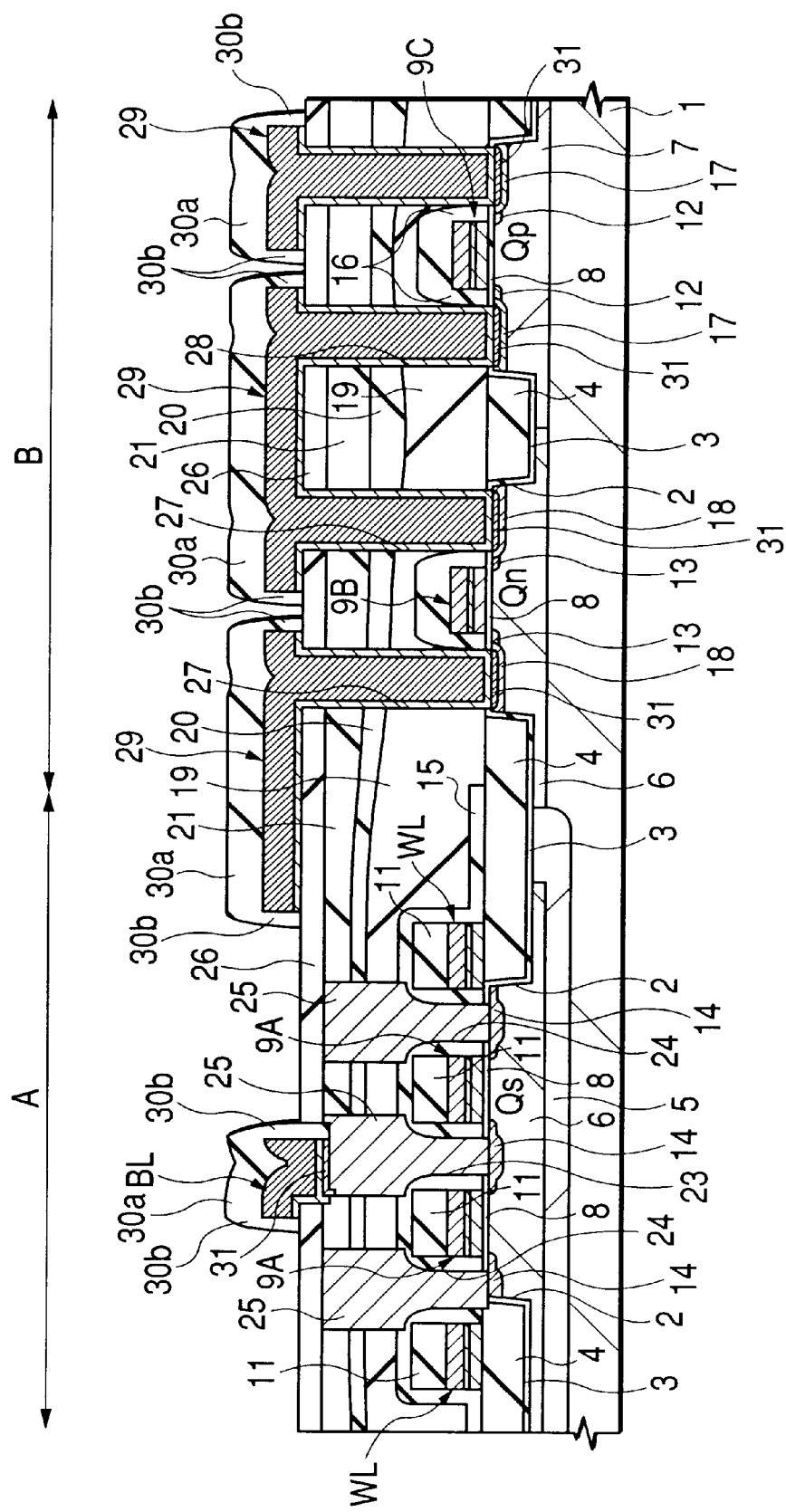
FIG. 15 is a cross-sectional view through the key parts of the semiconductor substrate and shows a step in the method of fabricating a DRAM, which is one embodiment of this invention.

Next, said photoresist is removed and bit line BL and first-layer wiring 29 are then formed on silicon oxide film 26, as shown in FIG. 15. For example, a titanium (Ti) film with a thickness of approximately 50 nm and a TiN film with a thickness of approximately 50 nm are deposited on silicon oxide film 26 by sputtering; further, films of W with a thickness of approximately 150 nm and of silicon nitride 30a with a thickness of approximately 200 nm are then deposited on the resulting surface by CVD. A photoresist is then used as a mask for patterning these films to form bit line BL and first-layer wiring 29.

Ti film is deposited on silicon oxide film 26, and the Ti film and substrate 1 are then made to react by applying annealing at approximately 800° C. to substrate 1. This forms a layer of low-resistance titanium silicide ($TiSi_2$) 31 over the surfaces of $p^+$-type semiconductor region 17 (source and drain) of p-channel MISFET Qp, $n^+$-type semiconductor region 18 (source and drain) of n-channel MISFET Qn, and plugs 25 embedded in contact holes 23. The contact resistance of wiring (bit line BL and first-layer wiring 29) connected to $p^+$-type semiconductor region 17, $n^+$-type semiconductor region 18, and plugs 25 is thus reduced. Furthermore, the sheet resistance can be reduced to 2 $\Omega$/? or less because bit line BL is constituted with the structure of W/TiN/Ti, so that bit line BL and first-layer wiring 29 in the peripheral circuits can be concurrently formed in the same process.

Next, said photoresist is removed. Sidewall spacers 30b are then formed on the sidewalls of respective bit line BL and first-layer wiring 29. In order to form sidewall spacers 30b, a silicon nitride film is deposited on the whole region including bit line BL and first-layer wiring 29 and this silicon nitride film is then anisotropically etched.

Figure 16:
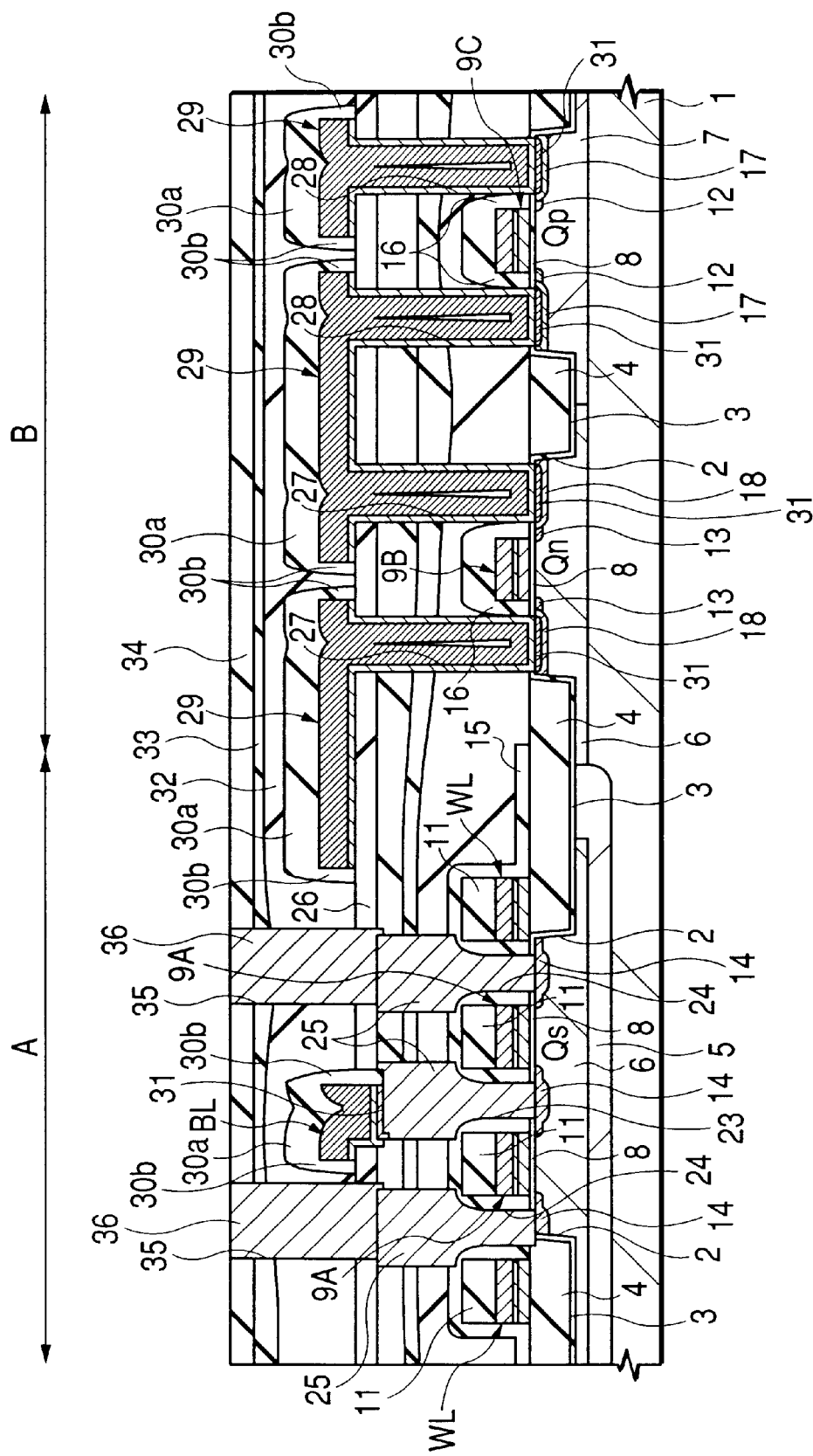
FIG. 16 is a cross-sectional view through the key parts of the semiconductor substrate and shows a step in the method of fabricating a DRAM, which is one embodiment of this invention.

Next, SOG film 32 is spin-coated on the whole region including bit line BL and first-layer wiring 29 to a thickness of approximately 300 nm. Substrate 1 is then annealed at 800' C. for approximately one minute to sinter the SOG film 32, as shown in FIG. 16.

Next, silicon oxide film 33 is deposited on SOG film 32 to a thickness of approximately 600 nm. This silicon oxide film 33 is then polished by CMP to flatten its surface. Silicon oxide film 33 is deposited by plasma CVD, for example, using TEOS and $O_3$ as source gases.

Next, silicon oxide film 34 is deposited to a thickness of approximately 100 nm on silicon oxide film 33. This silicon oxide film 34 is deposited to cover the fine scratches which have been created by CMP on the surface of said silicon oxide film 33. Silicon oxide film 34 is deposited by plasma CVD, for example, using TEOS and $O_3$ as source gases.

Next, silicon oxide films 34 and 33, SOG film 32, and silicon oxide film 26 over plugs 25 embedded in contact holes 24 are removed by dry-etching, using a photoresist as a mask to form through holes 35 which reach the surfaces of plugs 25. The conditions of this etching are such that the silicon nitride film is etched more quickly than the silicon oxide films 34, 33, and 26, and SOG film 32 so that silicon nitride film 30a on bit line BL and sidewall spacers 30b are not deeply etched even when there is a deviation between the alignments of through hole 35 and bit line BL. Through hole 35 is thus formed in a manner such that it is self-aligned with bit line BL.

Next, said photoresist is removed and plugs 36 are formed inside through holes 35. Specifically, a polycrystalline silicon film to which n-type impurities (for example, phosphorous) have been doped is deposited on silicon oxide film 34. This polycrystalline silicon film is then etched back and the polycrystalline silicon film remains in through holes 35 to form plugs 36.

Figure 17:
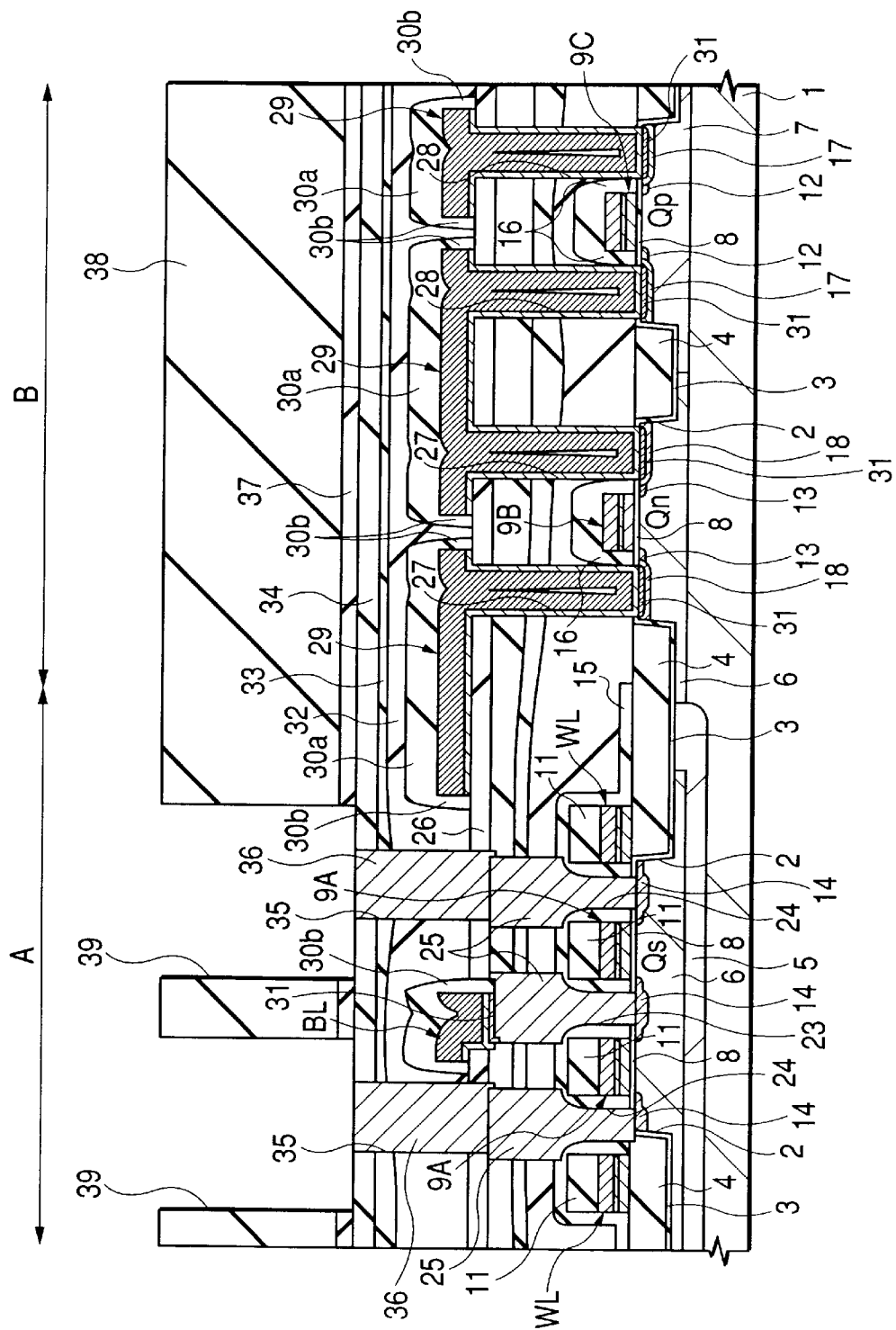
FIG. 17 is a cross-sectional view through the key parts of the semiconductor substrate and shows a step in the method of fabricating a DRAM, which is one embodiment of this invention.

Next, silicon nitride film 37 is deposited on silicon oxide film 34 to a thickness of approximately 100 nm by CVD, as shown in FIG. 17. Silicon oxide film 38 is then formed on silicon nitride film 37 to a thickness of approximately 1.3 $\mu$m. Next, grooves 39 are formed over through holes 35 by dry etching using a photoresist as a mask to remove silicon oxide film 38 and silicon nitride film 37. Silicon oxide film 38 is deposited by plasma CVD, for example, using TEOS and $O_3$ as source gases.

Figure 18:
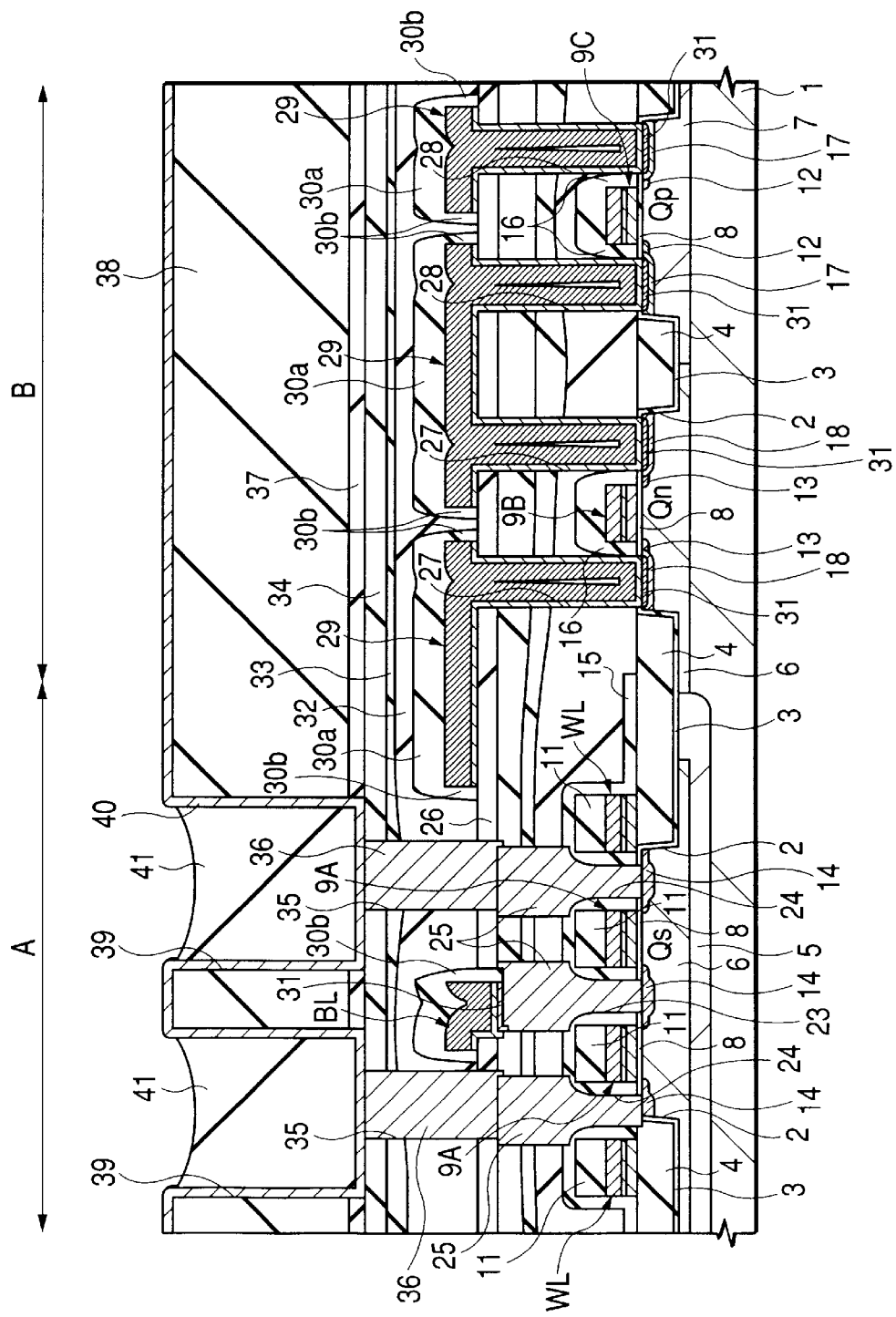
FIG. 18 is a cross-sectional view through the key parts of the semiconductor substrate and shows a step in the method of fabricating a DRAM, which is one embodiment of this invention.

Next, said photoresist is removed. Amorphous silicon film 40 is then deposited by CVD, at approximately 600° C., on silicon oxide film 38, as shown in FIG. 18. This amorphous silicon film 40 is used as a material of the storage electrode of a capacitor. Materials other than amorphous silicon film 40 that are suitable for use as the storage electrode include metal films, such as a film 40 of ruthenium (Ru) or of TiN.

Next, SOG film 41 is spin-coated on amorphous silicon film 40 to a thickness (for example, approximately 2 pm) that exceeds the depth of groove 39. SOG film 41 is then etched back to expose the amorphous silicon film 40 on silicon oxide film 38.

Figure 19:
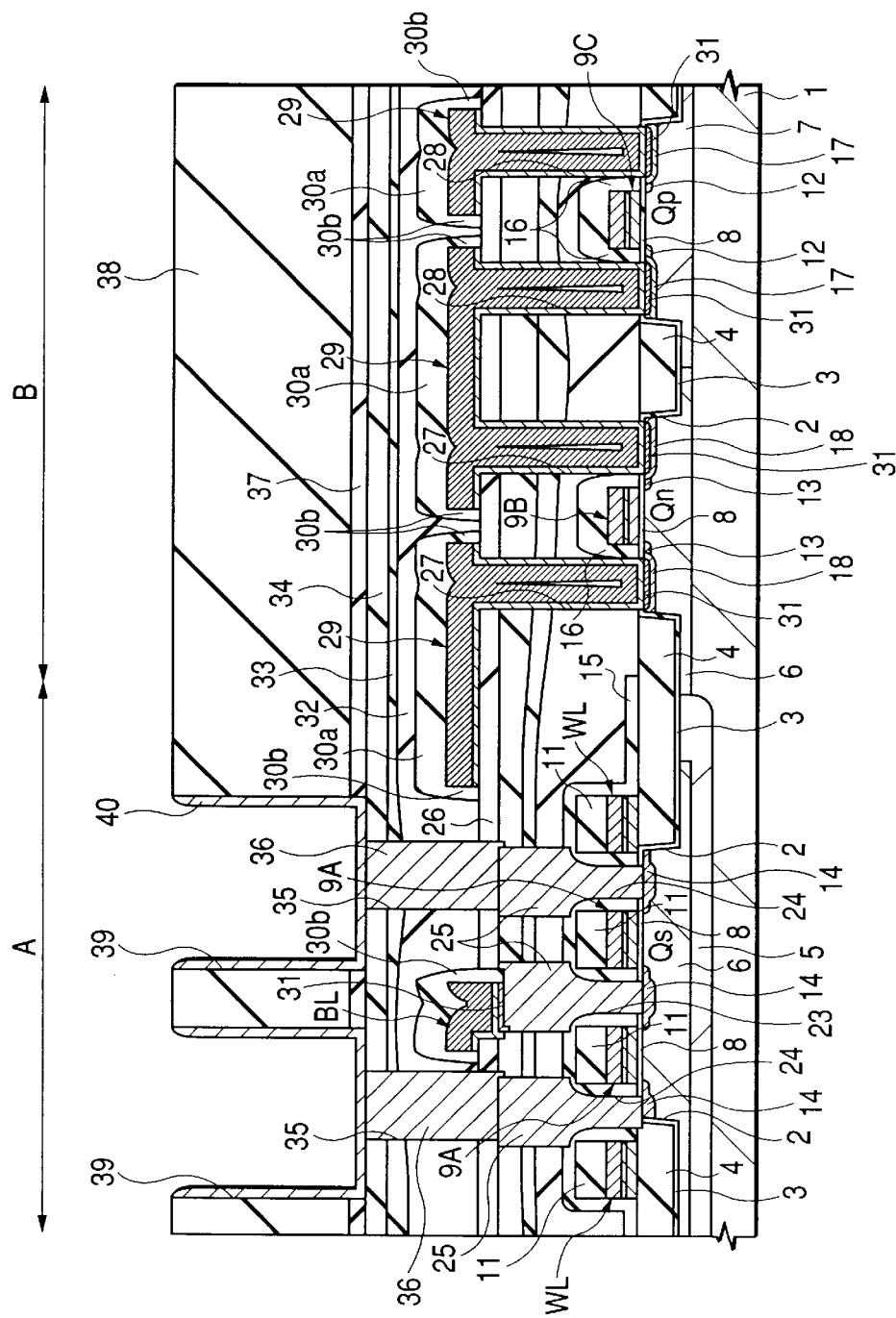
FIG. 19 is a cross-sectional view through the key parts of the semiconductor substrate and shows a step in the method of fabricating a DRAM, which is one embodiment of this invention.

Furthermore, amorphous silicon film 40 remains within grooves 39 (on the inner walls and bottoms) after etching back of amorphous silicon film 40 on silicon oxide film 38. This is shown in FIG. 19. Next, the storage electrode of a capacitor is formed by wet-etching of SOG film 41 inside groove 39.

Next, a tantalum oxide ($Ta_2O_5$) film 42 is deposited on the storage electrode to a thickness of approximately 20 This deposition is by thermal CVD at 600° C. or below, using $Ta(C_2H_5)_5$ and $O_3$ as source gases. Next, $Ta_2O_5$ film 42 is crystallized by annealing substrate 1 in an atmosphere of nitrogen and at approximately 650 to 700° C. for approximately 60 seconds. Afterwards, RTA (rapid thermal annealing) at approximately 600° C. can be applied to substrate 1 in an atmosphere of oxygen. Furthermore, oxygen defects in $Ta_2O_5$ film 42 are recovered by applying ozone-processing at 600 ' or below to substrate 1. $Ta_2O_5$ film 42, to which crystallizing processing and ozone processing are applied, is used as a capacitance-insulating film material of capacitor C.

Figure 20:
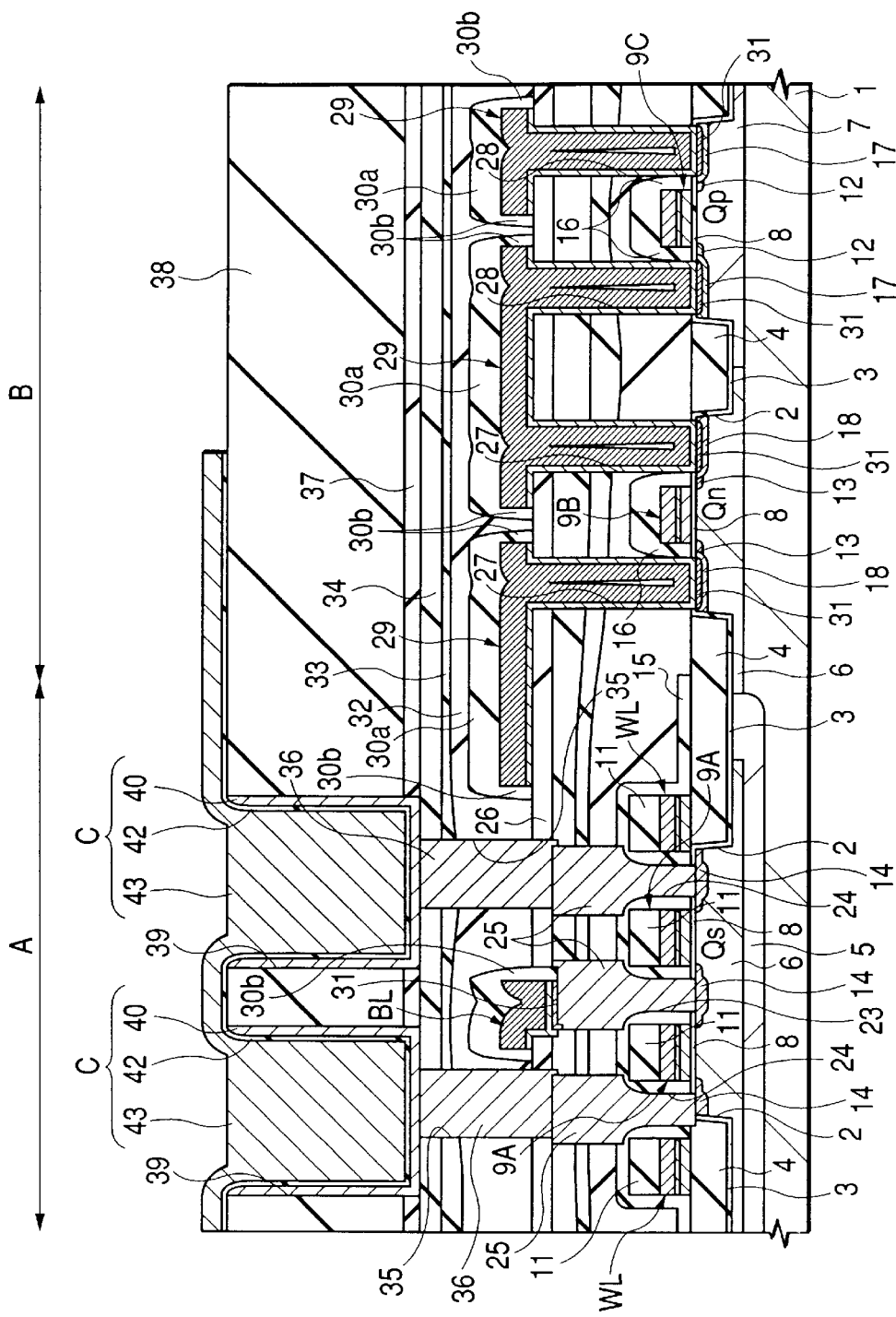
FIG. 20 is a cross-sectional view through the key parts of the semiconductor substrate and shows a step in the method of fabricating a DRAM, which is one embodiment of this invention.

Next, a metal film of, for example, Ru or TiN is deposited to a thickness of approximately 150 nm on $Ta_2O_5$ film 42 by sputtering or CVD. Said metal film and $Ta_2O_5$ film 42 are then patterned by dry-etching using a photoresist as a mask to form capacitors C. Capacitors C are comprised of plate electrode 43 made up of a metal film (a film of Ru or of TiN), a capacitance-insulating film made up of $Ta_2O_5$ film 42, and a storage electrode made up of amorphous silicon film 40. A DRAM memory cell comprised of memory-cell-selecting MISFET Qs and capacitors C, which are connected in series with the memory-cell-selecting MISFET Qs, has thus been completed, as shown in FIG. 20.

Figure 21:
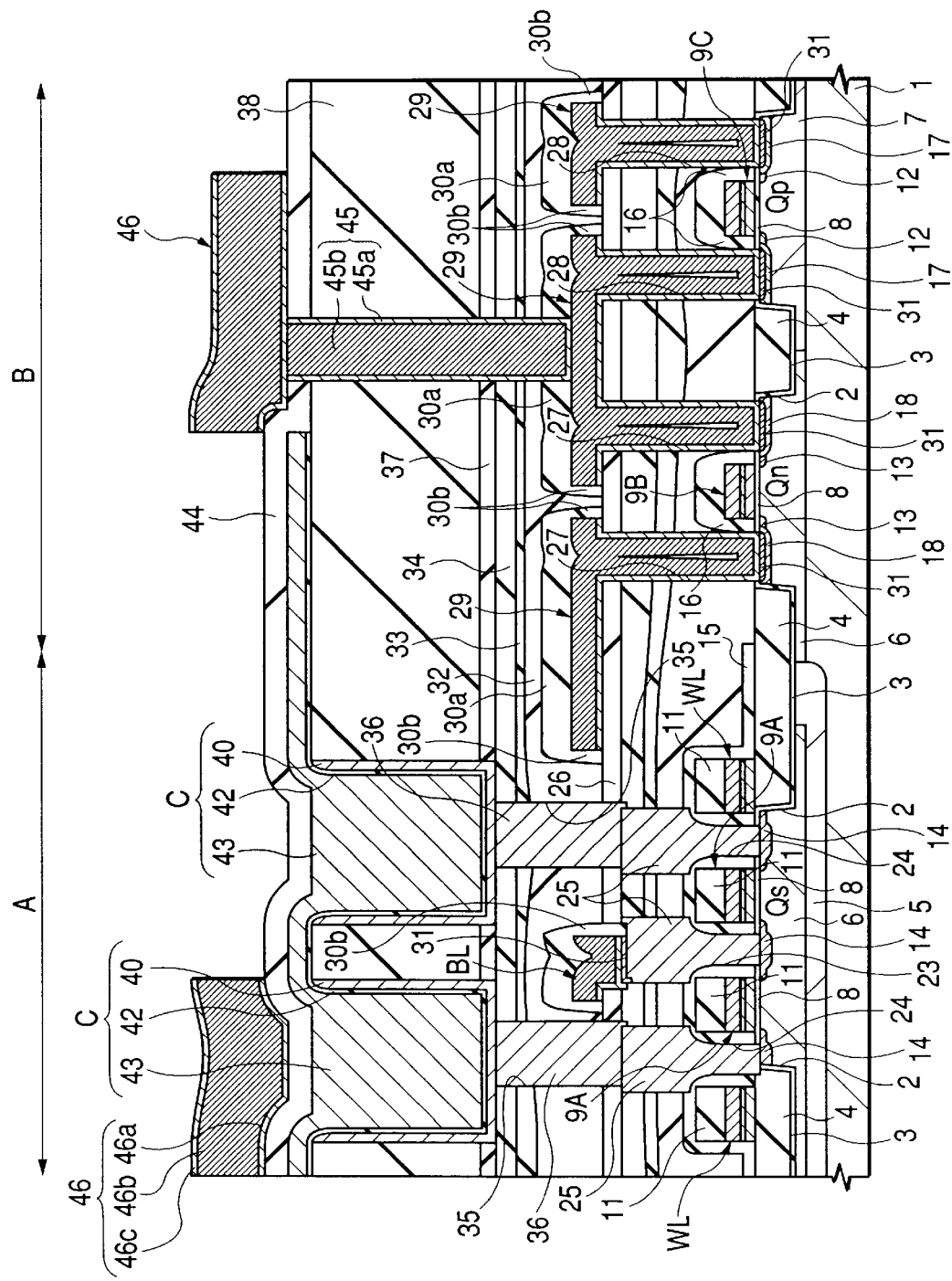
FIG. 21 is a cross-sectional view through the key parts of the semiconductor substrate and shows a step in the method of fabricating a DRAM, which is one embodiment of this invention.
Figure 22:
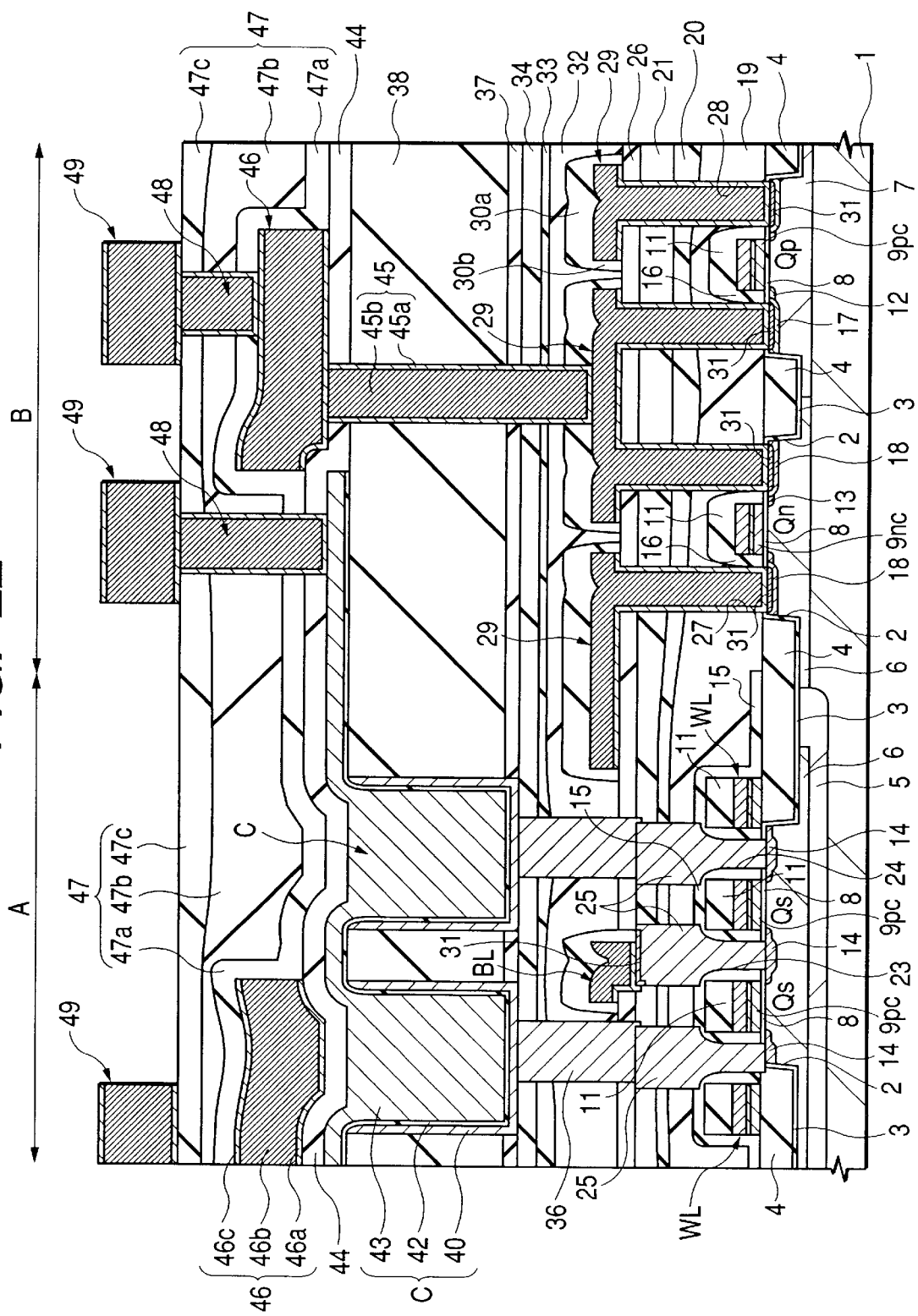
FIG. 22 is a cross-sectional view through the key parts of the semiconductor substrate and shows a step in the method of fabricating a DRAM, which is one embodiment of this invention.

Next, a silicon oxide film is deposited on plate electrode 43 to form insulating film 44. A connecting hole is opened in the peripheral circuit region for connection to first-layer wiring 29 and for the forming of plug 45. To form plug 45, adhesive layer 45a made up of a Ti film and a TiN film is deposited on insulating film 44, and W film 45 is deposited by blanket CVD. The W film 45b and bonding layer 45a are then etched back. It is possible to form the Ti film and TiN film by sputtering, however, CVD is also applicable. Furthermore, Ti film 46a, aluminum (Al) film 46b, and TiN film 46c are deposited, in that order and by sputtering, on insulting film 44. They are then patterned to form second-layer wiring 46, as shown in FIG. 21.

Finally, silicon oxide film 47a, SOG film 47b, and silicon oxide film 47c are deposited, in that order, on second-layer wiring 46 to form interlayer insulating film 47. Plugs 48 are then formed in the same manner as second-layer wiring 46. Said silicon oxide films 47a and 47c are deposited by plasma CVD, for example, TEOS and $O_3$ as source gases. Furthermore, third-layer wiring 49 is formed and the DRAM shown in FIG. 22 has almost been completed.

A passivation film is then deposited on the multiple layers of wiring and the top layer of wiring. This is not illustrated.

The characteristics of these transistors are shown in FIGS. 23 to 28:

case 1, an $n^+$-gate p-channel MISFET, the gate electrode of which is made up of an n-type polycrystalline silicon film in which n-type impurities (for example, phosphorous) have been implanted;

case 2, a $p^+$-gate p-channel MISFET, the gate electrode of which is made up of a p-type polycrystalline silicon film in which p-type impurities (for example, boron) have been implanted, and case 3, a $p^+$-gate p-channel MISFET, the gate electrode of which is made up of a p-type polycrystalline silicon film in which n-type impurities (for example, phosphorous) and p-type impurities (for example, boron) have been implanted.

Figure 23:
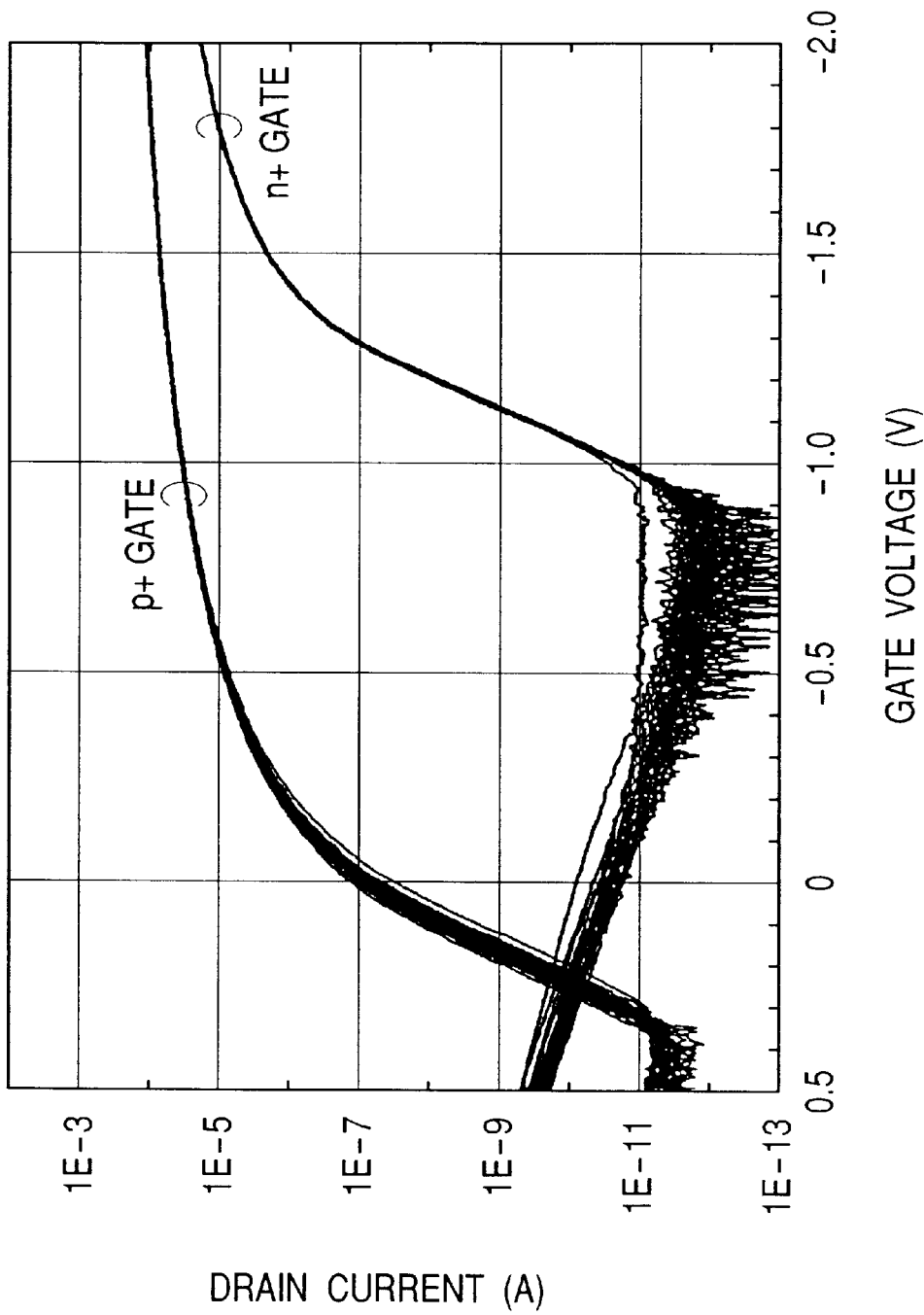
FIG. 23 is a graph that shows the relation of the $p^+$-gate voltage and drain current for the $p^+$-gate p-channel MISFET and $n^+$-gate p-channel MISFET.

FIG. 23 shows one example of the gate voltage-drain current characteristics of n'-gate p-channel MISFETs (case 1) and $n^+$-gate p-channel MISFETs (case 2). The difference between the threshold voltages of the $n^+$-gate p-channel MISFETs and the $p^+$-gate p-channel MISFETs should be 1.1 V, as this corresponds to the band-gap width of silicon (Si). However, the threshold voltages of the $p^+$-gate p-channel MISFETs are lowered in this case because of leakage of boron, and the difference thus becomes approximately 1.3 V, and the dispersion of the threshold voltages is thus increased.

Figure 24:
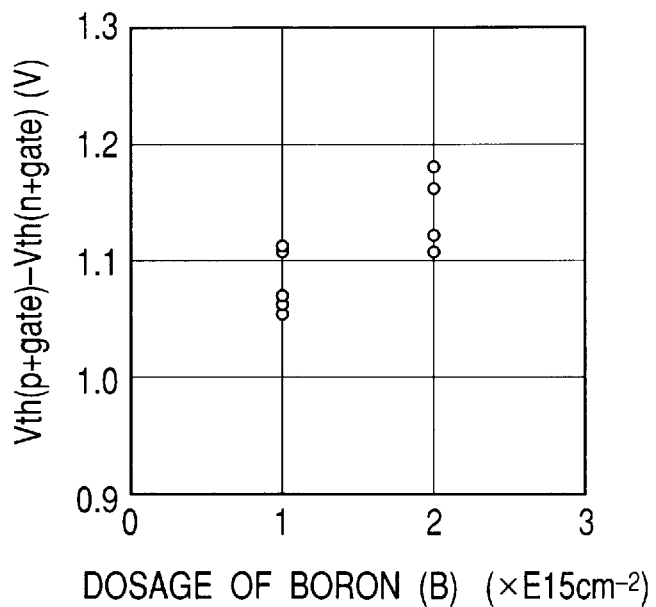
FIG. 24 is a graph that shows differences in threshold voltage between $p^+$-gate p-channel MISFETs and $n^+$-gate p-channel MISFETS.

FIG. 24 shows the relation of the differences between the threshold voltages of $n^+$-gate p-channel MISFETs (case 1) and $p^+$-gate p-channel MISFETs (case 2) and the dosages of boron ions (accelerated energy 5 keV) which are implanted in the p-type polycrystalline silicon films that configure the gate electrodes of the $p^+$-gate p-channel MISFETs (case 2). The figure shows the tendency for the difference between threshold voltages to increase above 1.1 V, that is, above the band-gap width, with increasing dosage. The difference thus appears to be caused by the increased leakage of boron in the $p^+$-gate p-channel MISFET that corresponds to the increased dosage.

Figure 25:
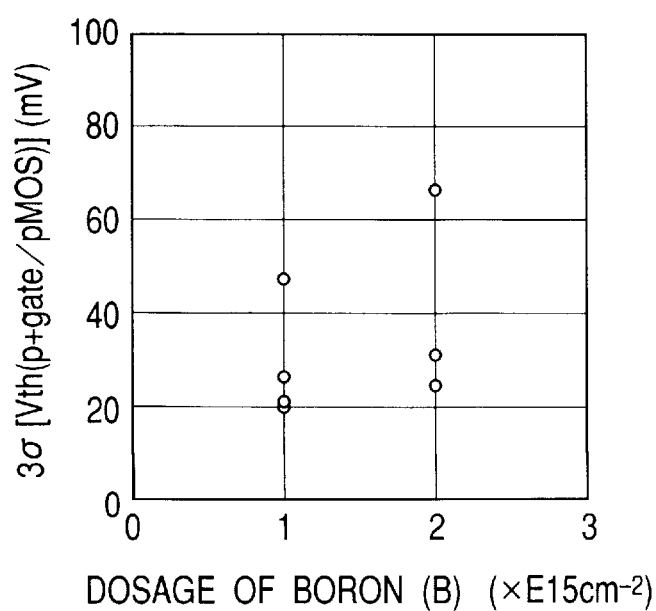
FIG. 25 is a graph that shows the dispersion in threshold voltage of the $p^+$-gate p-channel MISFET.

FIG. 25 shows the relation between the dispersion (3(Y) of the threshold voltages of $p^+$-gate p-channel MISFETs (case 2) and the dosages of boron ions (accelerated energy 5 keV) which are implanted in the p-type polycrystalline silicon films that configure the gate electrodes of the $p^+$-gate p-channel MISFETs (case 2). The figure shows that the dispersion of threshold voltages increases with the dosage. The difference thus appears to be caused by the increased leakage of boron in the $p^+$-gate p-channel MISFET that corresponds to the increased dosage.

Figure 26:
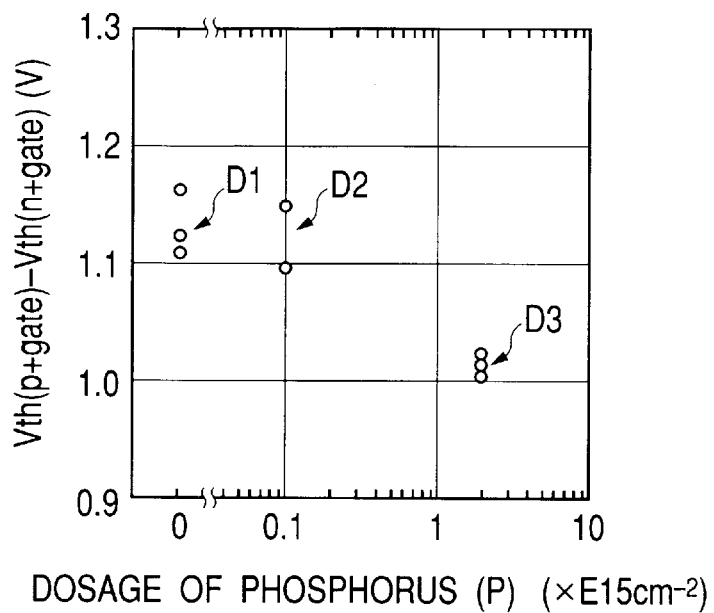
FIG. 26 is a graph that shows the effect of the implantation of phosphorus in $p^+$-gate p-channel MISFETs on differences in threshold voltage between $p^+$-gate p-channel MISFETs and $n^+$-gate p-channel MISFETS.

FIG. 26 shows differences between the threshold voltages of $n^+$-gate p-channel MISFETs (case 1) and $p^+$-gate p-channel MISFETs (case 2) and between the threshold voltages of $n^+$-gate p-channel MISFETs (case 1) and $p^+$-gate p-channel MISFETs (case 3). In the drawing, D1 indicates the value with regard to $p^+$-gate p-channel MISFETs (case 2) in which boron ions have been implanted at a dosage of approximately $2 \times 10^{15}$ $cm^{-2}$;

D2 indicates the value with regard to $p^+$-gate p-channel MISFETs (case 3) in which boron ions have been implanted at a dosage of approximately $2 \times 10^{15}$ $cm^{-2}$ and phosphorous ions have been implanted at a dosage of approximately $1 \times 10^{14}$ $cm^{-2}$ (accelerated energy 10 keV); and D3 indicates the value with regard to $p^+$-gate p-channel MISFETs (case 3) in which boron ions have been implanted at a dosage of approximately $3 \times 10^{15}$ $cm^{-2}$ CM and phosphorous ions have been implanted at a dosage of approximately $2 \times 10^{14}$ $cm^{-2}$ (accelerated energy 10 keV).

Figure 27:
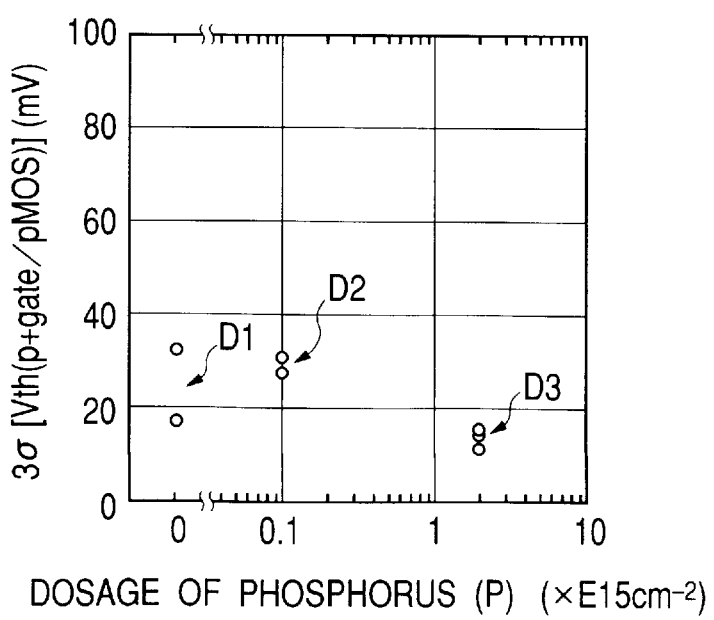
FIG. 27 is a graph that shows the effect of the implantation of phosphorus on the dispersion in threshold voltage of $p^+$-gate p-channel MISFETS.
Figure 28:
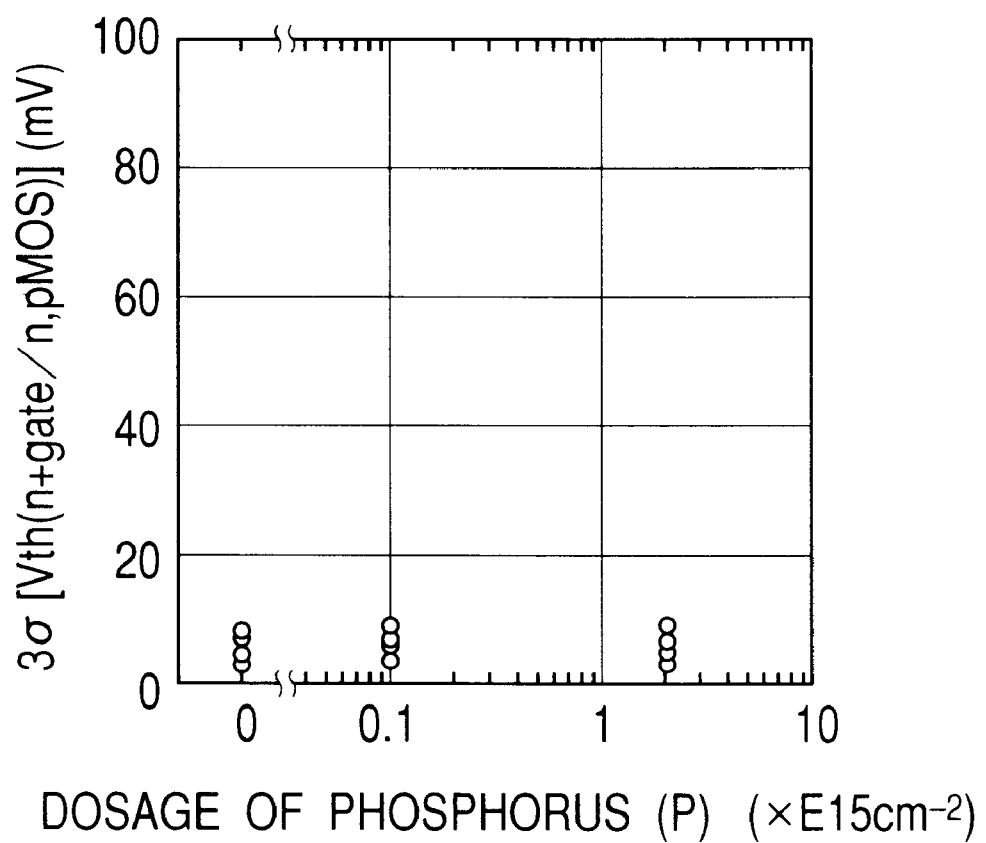
FIG. 28 is a graph that shows the dispersion in threshold voltage of the $n^+$-gate p-channel MISFET and $n^+$-gate n-channel MISFET.

FIG. 27 shows the dispersions (3(y) of threshold voltages in the p'-gate p-channel MISFETs (cases 2 and 3) used to obtain D1, D2, and D3 in the above-described FIG. 26. In addition, FIG. 28 shows the dispersions (3o) of the threshold voltages of $n^+$-gate p-channel MISFETs and $n^+$-gate n-channel MISFETS.

FIGS. 26 and 27 show that the dispersion of threshold voltages is suppressed at the same time as the differences in threshold voltages are decreased according to the increased dosage of phosphorous. In particular, despite the high dosage of boron, approximately $3 \times 10^{15}$ $cm^{-2}$, in the $p^+$-gate p-channel MISFETs (case 3) as shown at D3, the differences between the threshold voltages are small because phosphorous is present. Dispersion of the threshold voltages is also suppressed and approaches the dispersion of approximately 10 mV of the $n^+$-gate MISFETs shown in FIG. 28. Phosphorous coexisting with boron in a polycrystalline silicon film has priority in occupying the grain boundaries of silicon. It can be inferred that this suppresses the high-speed diffusion of boron along the grain boundaries of the silicon and prevents so-called boron leakage, in which boron reaches the channel region on the surface of a substrate.

In this embodiment, gate-insulating film 8 was made up of a silicon oxide film, however, it can be made up of an silicon oxynitride film through which boron leaks less than through a silicon oxide film. The silicon oxynitride film is formed by applying annealing at, for example, approximately 650° C., and in an atmosphere of nitrogen, to a silicon oxide layer formed on the surface of substrate 1.

In this embodiment, the diffusion of boron implanted in p-type polycrystalline silicon film 9pc is suppressed to prevent the leakage of boron into the channel region. This is done by implanting phosphorous in p-type polycrystalline silicon film 9pc which configures gate electrodes 9A (word lines WL) of the memory-cell-selecting MISFET Qs and in p-type polycrystalline silicon film 9pc which configures gate electrode 9C of p-channel MISFET Qp.

In addition, when p-type polycrystalline silicon film 9pc is formed to configure gate electrodes 9A (word lines WL) and 9C and n-type polycrystalline silicon film 9nc is formed to configure gate electrode 9B, the channeling effect in an amorphous silicon film with a thickness of 100 nm or less can be suppressed by ion-implanting impurities into the amorphous silicon film that is deposited on the substrate. Consequently, changes in the concentrations of impurities in the channel region, caused by the phenomenon that the ion-implanted impurities reach gate-insulating film 8 and even the interface with substrate 1, can thus be prevented.

In addition, placing a silicon nitride film 11 over gate electrodes 9A (word lines WL), 9B, and 9C prevents the implantation of impurities in p-type polycrystalline silicon film 9pc which configures gate electrodes 9A and 9C (word lines WL) and in n-type polycrystalline silicon film 9nc which configures gate electrode 9B, during the formation of the source and drain (n-type semiconductor region 14) of memory-cell-selecting MISFET Qs, the source and drain (p⁻type semiconductor region 12 and p⁺-type semiconductor region 17) of p-channel MISFET Qp, and the source and drain (n--type semiconductor region 13 and n⁺-gate semiconductor region 18) of n-channel MISFET Qn. Optimization of the concentrations of impurities in p-type polycrystalline silicon film 9pc and n-type polycrystalline silicon film 9nc and optimization of the concentrations of impurities in the source and drain are then possible. The most suitable device structures can thus be easily obtained for memory-cell-selecting MISFET Qs, p-channel MISFET Qp, and n-channel MISFET Qn.

In addition, when forming the sources and drains of memory-cell-selecting MISFET Qs (n-type semiconductor region 14), p-channel MISFET Qp (p⁻-type semiconductor region 12 and p⁺-type semiconductor region 17), and n-channel MISFET Qn (n⁻-type semiconductor region 13 and n-type semiconductor region 18), impurities are ion-implanted into substrate 1 and then activated by the application of annealing at 950° C. for approximately 10 seconds. Furthermore, to improve the reliability of the capacitance-insulating film of capacitor C, annealing is applied to crystallize the capacitance-insulating film right after it has been formed. Boron readily diffuses during annealing as described above. However, implanting phosphorous in p-type polycrystalline silicon film 9pc suppresses the diffusion of boron which has been implanted in p-type polycrystalline silicon film 9pc. Leakage of boron to the channel region is thus prevented, and this makes it possible to apply annealing to substrate 1. The most suitable concentration profile can thus be obtained for the sources and drains of memory-cell-selecting MISFET Qs (n-type semiconductor region 14), p-channel MISFET Qp (p⁻-type semiconductor region 12 and p⁺-type semiconductor region 17), and n-channel MISFET Qn (n⁻-type semiconductor region 13 and n⁺-type semiconductor region 18). The reliability of capacitor C is also improved.

In addition, silicon nitride film 15 which will be used as an etching stopper, is formed over gate electrodes 9A (word lines WL) of memory-cell-selecting MISFET Qs by plasma CVD. Although this silicon nitride film contains hydrogen, which facilitates the diffusion of boron, the diffusion of boron is suppressed by the phosphorous which has been implanted in p-type polycrystalline silicon film 9pc. Leakage of boron is thus prevented, so changes in the operating characteristics of the memory-cell-selecting MISFET Qs can be suppressed by using said silicon nitride film 15. Consequently, even when p-type polycrystalline silicon film 9pc is used as gate electrodes 9A (word lines WL) of memory-cell-selecting MISFET Qs, silicon nitride film 15 can be used as an etching stopper, so fine contact holes 23 and 24 can be formed in the spaces between gate electrodes 9A (word lines WL).

This invention has been described in detail above on the basis of an embodiment. However, this invention is not restricted to this embodiment; various modifications are possible without deviating from the essential points of the invention.

For example, the embodiment described above was applied to a method of fabricating a memory-cell-selecting MISFET of a memory array which configures a DRAM and an n-channel MISFET and p-channel MISFET in the peripheral circuits. The invention can also be applied to any method of fabricating an MISFET which has a gate electrode of p-type silicon.

Typical advantages obtained from the invention disclosed in this application are briefly described in the following paragraphs.

This invention effectively prevents the leakage of boron to the channel region by suppressing the diffusion of boron from the p-type silicon gate electrode and thus prevents changes in the operating characteristics of MISFETs in which the gate electrode is of p-type silicon.

In addition, this invention prevents the changes in concentration in the channel region that occur because of the channeling effect. Changes in the operating characteristics of an MISFET in which the gate electrode is of p-type silicon of a thickness of approximately 100= or less can thus be prevented.

In addition, this invention allows the independent setting of the concentrations of impurities in the p-type polycrystalline silicon film which configures the p-type silicon gate electrode and in the semiconductor region which configures the source and drain. Furthermore, the diffusion of boron from the p-type silicon gate electrode is suppressed and the leakage of boron to the channel region can be prevented, so that relatively high-temperature annealing can be applied. Thus the most suitable device structure for a given MISFET can be obtained.

What is claimed is:

1. A method for fabricating a semiconductor integrated circuit device having an MISFET with a p-type gate electrode, comprising the steps of:

(a) forming a gate-insulating film over the surface of the substrate;

(b) depositing an amorphous silicon film over said gate-insulating film;

(c) forming an n-type film by ion-implanting n-type impurities in said amorphous silicon film;

(d) converting said n-type film into a p-type film by ion-implanting p-type impurities in said n-type film; and (e) forming said gate electrode by etching said p-type film.

2. A method for fabricating a semiconductor integrated circuit device, as defined in claim 1, wherein said n-type impurities are phosphorus and said p-type impurities are boron.

3. A method for fabricating a semiconductor integrated circuit device, as defined in claim 1, wherein said gate insulating film is a silicon oxynitride film.

4. A method for fabricating a semiconductor integrated circuit device, as defined in claim 1, and further comprising the step, after step (d), of crystallizing said p-type film.

5. A method for fabricating a semiconductor integrated circuit device, as defined in claim 1, and further comprising the step, after step (c), of crystallizing said n-type film.

6. A method for fabricating a semiconductor integrated circuit device, as defined in claim 1, and further comprising the steps, before step (e), of depositing a refractory-metal film on said p-type film and, in step (e), etching, in order, said refractory-metal film and said p-type film.

7. A method for fabricating a semiconductor integrated circuit device, as defined in claim 1, and further comprising the steps, before step (e), of depositing a refractory-metal film and insulating film on said p-type film and, in step (e), etching, in order, said insulating film, said refractory-metal film and said p-type film.

8. A method for fabricating a semiconductor integrated circuit device, as defined in claim 1, and further comprising the step of (f) forming semiconductor regions to constitute a source and drain.

9. A method for fabricating a semiconductor integrated circuit device, as defined in claim 1, and further comprising the steps of:

(f) forming semiconductor regions to constitute a source and drain; and (g) forming a capacitor connected to one of the semiconductor regions that constitute said source and drain.

10. A method for fabricating a semiconductor integrated circuit device having a first MISFET with a source and drain constructed of p-type semiconductor regions and a second MISFET with a source and drain constructed of n-type semiconductor regions, comprising the steps of:

(a) forming a gate-insulating film over the surface of the substrate;

(b) depositing an amorphous silicon film over said gate-insulating film;

(c) forming an n-type film by ion-implanting n-type impurities in said amorphous silicon film;

(d) converting said n-type film, at least in the region where said first MISFET will be formed, into a p-type film by ion-implanting p-type impurities in said n-type film; and (e) forming the gate electrode of said first MISFET by etching said p-type film.

11. A method for fabricating a semiconductor integrated circuit device, as defined in claim 10, wherein said n-type impurities are phosphorus and said p-type impurities are boron.

12. A method for fabricating a semiconductor integrated circuit device, as defined in claim 10, wherein said gate insulating film is a silicon oxynitride film.

13. A method for fabricating a semiconductor integrated circuit device, as defined in claim 10, and further comprising the step, after said step (d), of crystallizing said p-type film.

14. A method for fabricating a semiconductor integrated circuit device, as defined in claim 10, and further comprising the step, after said step (c), of crystallizing said n-type film.

15. A method for fabricating a semiconductor integrated circuit device, as defined in claim 10, and further comprising the steps, before said step (e), of depositing a refractory-metal film on said p-type film and, in step (e), etching, in order, said refractory-metal film and said p-type film.

16. A method for fabricating a semiconductor integrated circuit device, as defined in claim 10, and further comprising the steps, before said step (e), of depositing, in order, a refractory-metal film and insulating film on said p-type film, and in said step (e), etching, in order, said insulating film, said refractory-metal film, and said p-type film.

17. A method for fabricating a semiconductor integrated circuit device, as defined in claim 10, and further comprising the step of (e) forming p-type semiconductor regions to constitute the source and drain of said first MISFET.

18. A method for fabricating a semiconductor integrated circuit device, as defined in claim 10, wherein the region where said second MISFET will be formed is masked against the ion-implantation of said step (d).

19. A method for fabricating a semiconductor integrated circuit device, as defined in claim 10, wherein said step (d) includes a step in which the region where said second MISFET will be formed is masked while p-type impurities are ion-implanted in said n-type film and a step in which the region where said first MISFET will be formed is masked while n-type impurities are ion-implanted in said n-type film.

20. A method for fabricating a semiconductor integrated circuit device, as defined in claim 10, wherein the dose of said ion-implanted p-type impurities is relatively larger than the dose of said ion-implanted n-type impurities.

21. A method for fabricating a semiconductor integrated circuit device, as defined in claim 10, wherein the thickness of said amorphous silicon film is 100 nm or less.

22. A method for fabricating a semiconductor integrated circuit device, as defined in claim 10, and further comprising the steps of:

(f) forming p-type semiconductor regions which constitute the source and drain of said first MISFET;

(g) forming, in order, a silicon nitride film and a silicon oxide film on said substrate;

(h) using a photoresist pattern as a mask in forming an opening in said silicon oxide film and said silicon nitride film by etching said silicon oxide film with said silicon nitride film as an etching stopper and then etching said silicon nitride film; and (i) forming plugs inside said opening.

23. A method for fabricating a semiconductor integrated circuit device having a first MISFET with a source and drain constructed of a p-type semiconductor region and a second MISFET having a source and drain constructed of an n-type semiconductor region, comprising the steps of:

(a) forming a gate-insulating film over the surface of the substrate;

(b) depositing an amorphous silicon film over said gate-insulating film;

(c) forming an n-type film by ion-implanting n-type impurities in said amorphous silicon film;

(d) converting said n-type film, in the region where said first MISFET will be formed, into a p-type film by ion-implanting p-type impurities in said n-type film; and (e) forming the gate electrode of said first MISFET by etching said p-type film and forming the gate electrode of said second MISFET by etching said n-type film.

24. A method for fabricating a semiconductor integrated circuit device, as defined in claim 23, wherein said n-type impurities are phosphorus and said p-type impurities are boron.

25. A method for fabricating a semiconductor integrated circuit device, as defined in claim 23, wherein said gate insulating film is a silicon-oxynitride film.

26. A method for fabricating a semiconductor integrated circuit device, as defined in claim 23, and further comprising the steps, after said step (d), of crystallizing said p-type film and n-type film.

27. A method for fabricating a semiconductor integrated circuit device, as defined in claim 23, and further comprising the steps, after said step (c), of crystallizing said n-type film.

28. A method for fabricating a semiconductor integrated circuit device, as defined in claim 23, and further comprising the steps, before said step (e), of depositing a refractory-metal film on said p-type film and said n-type film, and in step (e), etching, in order, said refractory-metal film and said p-type film and, simultaneously and in order, said refractory-metal film and said n-type film.

29. A method for fabricating a semiconductor integrated circuit device, as defined in claim 23, and further comprising the steps, before said step (e), of depositing, in order, a refractory-metal film and insulating film on said p-type and n-type films, and in step (e), etching, in order, said cap of insulating film, said refractory-metal film, and said p-type film and, simultaneously and in order, said insulating film, said refractory-metal film, and said n-type film.

30. A method for fabricating a semiconductor integrated circuit device, as defined in claim 23, and further comprising the steps of (f) forming p-type semiconductor regions which constitute the source and drain of said first MISFET and forming n-type semiconductor regions which constitute the source and drain of said second MISFET.

31. A method for fabricating a semiconductor integrated circuit device, as defined in claim 23, wherein the region where said second MISFET will be formed is masked against the ion-implantation of said step (d).

32. A method for fabricating a semiconductor integrated circuit device, as defined in claim 23, wherein said step (d) includes a step in which the region where said second MISFET will be formed is masked while p-type impurities are ion-implanted in said n-type film and a step in which the region where said first MISFET will be formed is masked while n-type impurities are ion-implanted in said n-type film.

33. A method for fabricating a semiconductor integrated circuit device, as defined in claim 23, wherein the dose of said ion-implanted p-type impurities is relatively larger than the dose of said ion-implanted n-type impurities.

34. A method for fabricating a semiconductor integrated circuit device, as defined in claim 23, wherein the thickness of said amorphous silicon film is 100 nm or less.

35. A method for fabricating a semiconductor integrated circuit device, as defined in claim 23, and further comprising the steps of:

(f) forming p-type semiconductor regions which constitute the source and drain of said first MISFET and forming n-type semiconductor region which constitute the source and drain of said second MISFET;

(g) forming, in order, a silicon nitride film and a silicon oxide film on said substrate;

(h) using a photoresist pattern as a mask in forming an opening in said silicon oxide film and said silicon nitride film by etching said silicon oxide film with said silicon-nitride film as an etching stopper and then etching said silicon nitride film; and (i) forming plugs inside said opening.

36. A method for fabricating a semiconductor integrated circuit device having a memory cell in which an MISFET and a capacitor are connected in series, comprising the steps of:

(a) forming a gate-insulating film over the surface of the substrate;

(b) depositing an amorphous silicon film over said gate-insulating film;

(c) forming an n-type film by ion-implanting n-type impurities in said amorphous silicon film;

(d) converting said n-type film into a p-type film by ion-implanting p-type impurities in said n-type film;

(e) forming a gate electrode by etching said p-type film;

(f) forming n-type semiconductor regions which constitute the source and drain of said MISFET;

(g) forming the first capacitor electrode connected to one of the n-type semiconductor regions which constitute said source and drain;

(h) forming a dielectric film on the surface of said first capacitor electrode;

(i) annealing said substrate; and (j) forming the second capacitor electrode on said dielectric film.

\* \* \* \* \*